US008848731B2

(12) United States Patent
Das et al.

(10) Patent No.: US 8,848,731 B2
(45) Date of Patent: Sep. 30, 2014

(54) SYSTEM AND METHOD FOR FACILITATING DATA TRANSFER USING A SHARED NON-DETERMINISTIC BUS

(75) Inventors: Srinjoy Das, Solana Beach, CA (US); Philip Crary, Mission Viejo, CA (US); Alexander Raykhman, Irvine, CA (US)

(73) Assignee: QUALCOMM Incorporated, San Diego, CA (US)

( * ) Notice: Subject to any disclaimer, the term of this patent is extended or adjusted under 35 U.S.C. 154(b) by 592 days.

(21) Appl. No.: 13/186,391

(22) Filed: Jul. 19, 2011

(65) Prior Publication Data

US 2012/0195350 A1    Aug. 2, 2012

Related U.S. Application Data

(60) Provisional application No. 61/438,234, filed on Jan. 31, 2011.

(51) Int. Cl.
*G01S 19/24* (2010.01)
*G06F 13/16* (2006.01)
*G06F 13/42* (2006.01)
*G06F 13/40* (2006.01)
*G06F 13/18* (2006.01)
*G11C 7/10* (2006.01)

(52) U.S. Cl.
CPC ........ *G06F 13/1626* (2013.01); *G06F 13/1663* (2013.01); *G06F 13/4234* (2013.01); *G06F 13/4059* (2013.01); *G06F 13/1605* (2013.01); *G11C 7/1039* (2013.01); *G06F 13/18* (2013.01)
USPC ........................................ 370/462

(58) Field of Classification Search
CPC ...................................................... G01S 19/37
USPC ............................................... 370/462
See application file for complete search history.

(56) References Cited

U.S. PATENT DOCUMENTS

| 5,442,390 A | 8/1995 | Hooper et al. |
| 5,448,706 A | 9/1995 | Fleming et al. |
| 5,535,377 A | 7/1996 | Parks |
| 5,548,620 A | 8/1996 | Rogers |
| 5,822,779 A | 10/1998 | Intrater et al. |
| 5,887,191 A | 3/1999 | Adiga et al. |

(Continued)

FOREIGN PATENT DOCUMENTS

| EP | 2192496 A1 | 6/2010 |
| WO | WO 00/62154 A1 | 10/2000 |
| WO | WO 2004/107187 A1 | 12/2004 |
| WO | WO 2007/071889 A1 | 6/2007 |

OTHER PUBLICATIONS

International Search Report and Written Opinion—PCT/US2012/021521—ISAEPO—Apr. 27, 2012.

(Continued)

*Primary Examiner* — Melvin Marcelo
(74) *Attorney, Agent, or Firm* — Mahamedi Paradice LLP

(57) ABSTRACT

System and method for facilitating data transfer between logic systems and a memory according to various conditions. Embodiments include systems and methods for facilitating and improving throughput of data transfers using a shared non-deterministic bus, a system and method for managing a memory as a circular buffer, and a system and method for facilitating data transfer between a first clock domain and a second clock domain. Embodiments may be implemented individually or in combination.

18 Claims, 24 Drawing Sheets

(56) References Cited

U.S. PATENT DOCUMENTS

| | | |
|---|---|---|
| 5,896,539 A | 4/1999 | Arimilli et al. |
| 5,938,748 A | 8/1999 | Lynch et al. |
| 6,079,001 A | 6/2000 | Le et al. |
| 6,104,700 A | 8/2000 | Haddock et al. |
| 6,272,567 B1 | 8/2001 | Pal et al. |
| 6,345,328 B1 | 2/2002 | Rozario et al. |
| 6,359,900 B1 | 3/2002 | Dinakar et al. |
| 6,363,461 B1 | 3/2002 | Pawlowski et al. |
| 6,378,035 B1 | 4/2002 | Parry et al. |
| 6,415,367 B1 | 7/2002 | Baxter et al. |
| 6,438,651 B1 | 8/2002 | Slane |
| 6,483,846 B1 | 11/2002 | Huang et al. |
| 6,516,362 B1 | 2/2003 | Magro et al. |
| 6,529,935 B1 | 3/2003 | MacInnis et al. |
| 6,549,593 B1 | 4/2003 | Rumreich et al. |
| 6,567,094 B1 | 5/2003 | Curry et al. |
| 6,665,536 B1 | 12/2003 | Mahany |
| 6,745,314 B1 | 6/2004 | Wichman |
| 6,754,509 B1 | 6/2004 | Khan et al. |
| 6,804,738 B2 | 10/2004 | Weber |
| 6,807,589 B2 | 10/2004 | Apfeldorfer et al. |
| 6,807,615 B1 | 10/2004 | Wong et al. |
| 6,820,150 B1 | 11/2004 | Joy et al. |
| 6,889,346 B2 | 5/2005 | Abdelilah et al. |
| 6,954,869 B2 | 10/2005 | Syed |
| 6,982,986 B2 | 1/2006 | Goetzinger et al. |
| 7,009,992 B2 | 3/2006 | McKinnon |
| 7,010,060 B2 | 3/2006 | Ledvina et al. |
| 7,046,676 B2 | 5/2006 | Goetzinger et al. |
| 7,085,952 B2 | 8/2006 | Huelskamp |
| 7,103,051 B2 | 9/2006 | Goetzinger et al. |
| 7,103,735 B2 | 9/2006 | Iyer |
| 7,191,257 B2 | 3/2007 | Ali Khan et al. |
| 7,200,691 B2 | 4/2007 | Ali Khan et al. |
| 7,234,071 B2 | 6/2007 | Ferrara |
| 7,239,884 B2 | 7/2007 | Khawand et al. |
| 7,302,684 B2 | 11/2007 | Hsieh |
| 7,426,709 B1 | 9/2008 | Ganesan |
| 7,475,221 B1 | 1/2009 | Metzgen et al. |
| 7,500,132 B1 | 3/2009 | Pothireddy et al. |
| 7,502,969 B2 | 3/2009 | Beard et al. |
| 7,548,562 B2 | 6/2009 | Ward et al. |
| 7,594,047 B2 | 9/2009 | Luk |
| 7,636,022 B2 | 12/2009 | Shenoi |
| 7,649,860 B2 | 1/2010 | Kang et al. |
| 7,689,739 B2 | 3/2010 | Li et al. |
| 7,725,646 B2 | 5/2010 | Molotchko et al. |
| 7,725,657 B2 | 5/2010 | Hasenplaugh et al. |
| 7,729,450 B2 | 6/2010 | Thor et al. |
| 7,743,177 B2 | 6/2010 | Jia et al. |
| 7,764,665 B2 | 7/2010 | Rogers et al. |
| 7,779,286 B1 | 8/2010 | Pritchard et al. |
| 7,796,610 B2 | 9/2010 | Fan et al. |
| 7,797,393 B2 | 9/2010 | Qiu et al. |
| 7,802,040 B2 | 9/2010 | Aldworth et al. |
| 7,809,972 B2 | 10/2010 | Tune et al. |
| 7,813,459 B2 | 10/2010 | Hasan et al. |
| 7,830,893 B2 | 11/2010 | Ward |
| 7,844,817 B2 | 11/2010 | Mueller et al. |
| 7,885,281 B2 | 2/2011 | Sindhu et al. |
| 8,045,582 B1 | 10/2011 | Petrus et al. |
| 8,214,583 B2 | 7/2012 | Sinclair et al. |
| 8,255,610 B2 | 8/2012 | Satpathy et al. |
| 2002/0032820 A1* | 3/2002 | Jahnke et al. ................ 710/240 |
| 2002/0065948 A1 | 5/2002 | Morris et al. |
| 2003/0074520 A1 | 4/2003 | Weber |
| 2003/0159081 A1 | 8/2003 | MacLellan et al. |
| 2004/0226016 A1 | 11/2004 | Sreejith |
| 2004/0243785 A1 | 12/2004 | Shanmugasundaram et al. |
| 2005/0058149 A1 | 3/2005 | Howe |
| 2005/0105616 A1 | 5/2005 | Kim et al. |
| 2005/0138252 A1 | 6/2005 | Gwilt |
| 2005/0228913 A1 | 10/2005 | Matthews et al. |
| 2005/0262314 A1 | 11/2005 | Oh |
| 2007/0038792 A1 | 2/2007 | Shin |
| 2007/0208980 A1 | 9/2007 | Gregorius et al. |
| 2007/0283064 A1 | 12/2007 | Lai |
| 2008/0107396 A1 | 5/2008 | Chung et al. |
| 2008/0256270 A1 | 10/2008 | Hubbs et al. |
| 2009/0043920 A1 | 2/2009 | Kuris et al. |
| 2009/0306839 A1 | 12/2009 | Youngquist et al. |
| 2010/0061426 A1 | 3/2010 | Eerola |
| 2010/0111117 A1 | 5/2010 | Kolinummi et al. |
| 2010/0312985 A1 | 12/2010 | Rostedt |
| 2010/0325368 A1 | 12/2010 | O'Brien et al. |
| 2010/0327923 A1 | 12/2010 | Pyeon et al. |
| 2011/0023052 A1 | 1/2011 | Huang et al. |
| 2011/0047271 A1 | 2/2011 | Guibe et al. |
| 2011/0102258 A1* | 5/2011 | Underbrink et al. ..... 342/357.47 |
| 2012/0198117 A1 | 8/2012 | Das et al. |
| 2012/0198181 A1 | 8/2012 | Das et al. |
| 2012/0198267 A1 | 8/2012 | Das et al. |

OTHER PUBLICATIONS

International Search Report and Written Opinion—PCT/US2012/021555—ISA/EPO—Apr. 5, 2012.

* cited by examiner

EXCEPTION HANDLING BETWEEN DPT_SS AND DSP_SS
Step 1: PRE error message to DPT
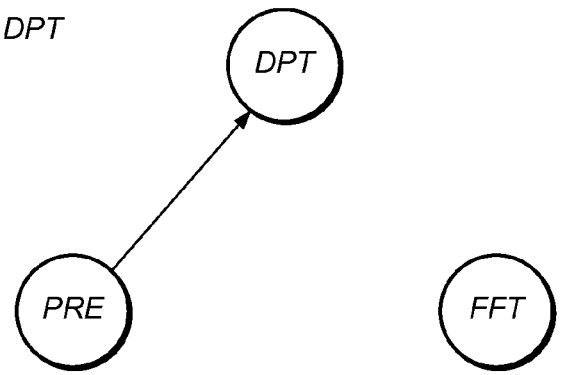
Step 2: DPT broadcast to all DSP subsystems
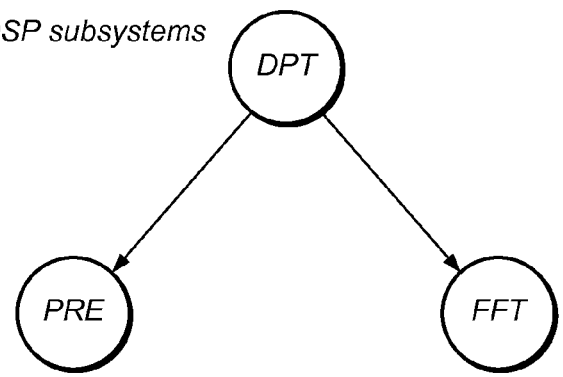
FIG. 9
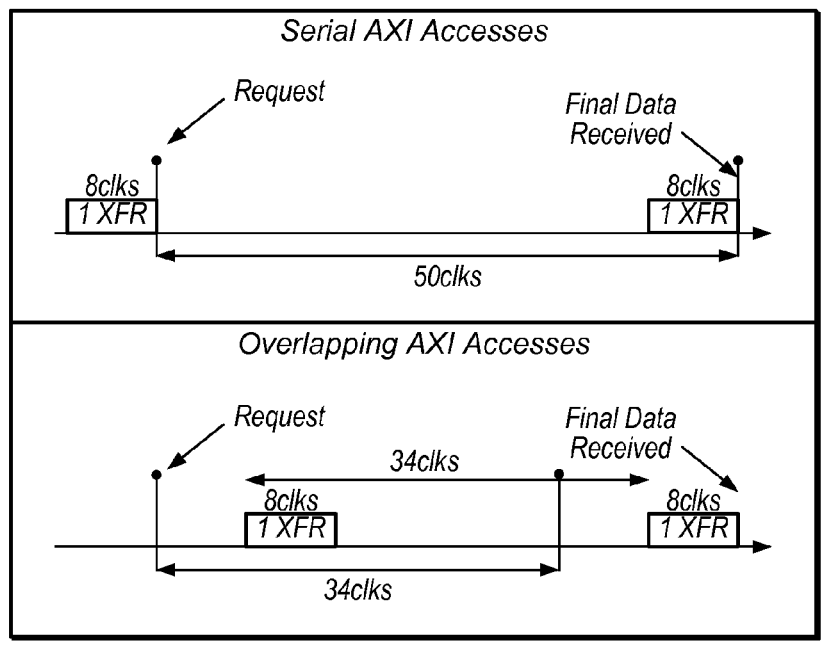
FIG. 10

MEMORY PACKING FOR GPS AND GLO

GPS FIFO VIEW

GPS CIRCULAR BUFFER VIEW IN DDR

GPS DATA ARRIVAL (with 4:1 decimation)

| I4, Q4 (1) | I4, Q4 (2) | I4, Q4 (3) | I4, Q4 (4) |
|---|---|---|---|
| BYTE-1 | BYTE-2 | BYTE-3 | BYTE-4 |

TIME →

| BYTE-4 | BYTE-3 | BYTE-2 | BYTE-1 | WORD #2 |
| BYTE-4 | BYTE-3 | BYTE-2 | BYTE-1 | WORD #1 |

GLO FIFO VIEW

GLO CIRCULAR BUFFER VIEW IN DDR

GLO DATA ARRIVAL (with bypass)

| I2,Q2 NIB#1 | I2,Q2 NIB#2 | I2,Q2 NIB#3 | I2,Q2 NIB#4 | I2,Q2 NIB#5 | I2,Q2 NIB#6 | I2,Q2 NIB#7 | I2,Q2 NIB#8 | I2,Q2 NIB#1 | I2,Q2 NIB#2 | I2,Q2 NIB#3 | I2,Q2 NIB#4 | I2,Q2 NIB#5 | I2,Q2 NIB#6 | I2,Q2 NIB#7 | I2,Q2 NIB#8 |
|---|---|---|---|---|---|---|---|---|---|---|---|---|---|---|---|
| BYTE-1 | | BYTE-2 | | BYTE-3 | | BYTE-4 | | BYTE-1 | | BYTE-2 | | BYTE-3 | | BYTE-4 | |

TIME →

| BYTE-4 | BYTE-3 | BYTE-2 | BYTE-1 | WORD #2 |
| BYTE-4 | BYTE-3 | BYTE-2 | BYTE-1 | WORD #1 |

Note: WORD INDICES INCREASE WITH INCREASING TIME IN BOTH CASES

FIG. 13

SEARCH TYPES IN CIRCULAR BUFFER DDR MEMORY
TYPE-1 SEARCH (SEARCH_LIMIT > SEARCH_BASE)
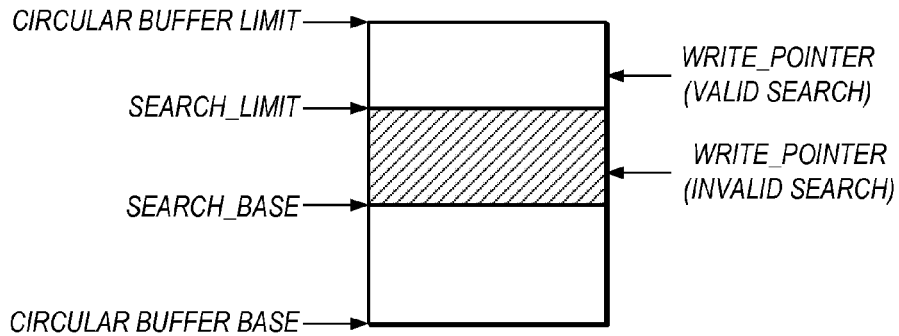
TYPE-2 SEARCH (SEARCH_LIMIT < SEARCH_BASE)
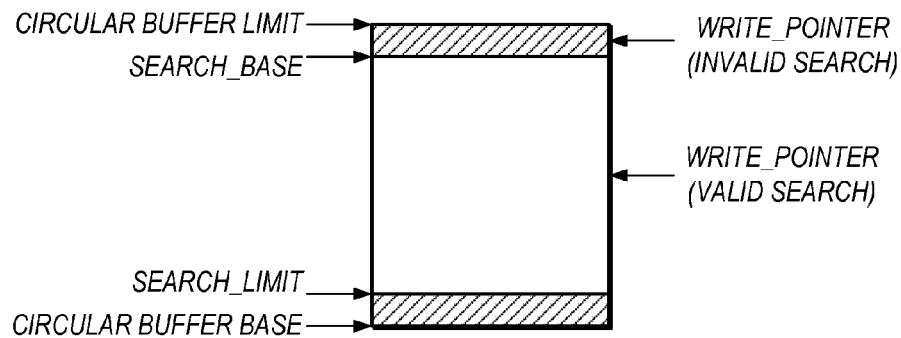
CIRCULAR VIEW
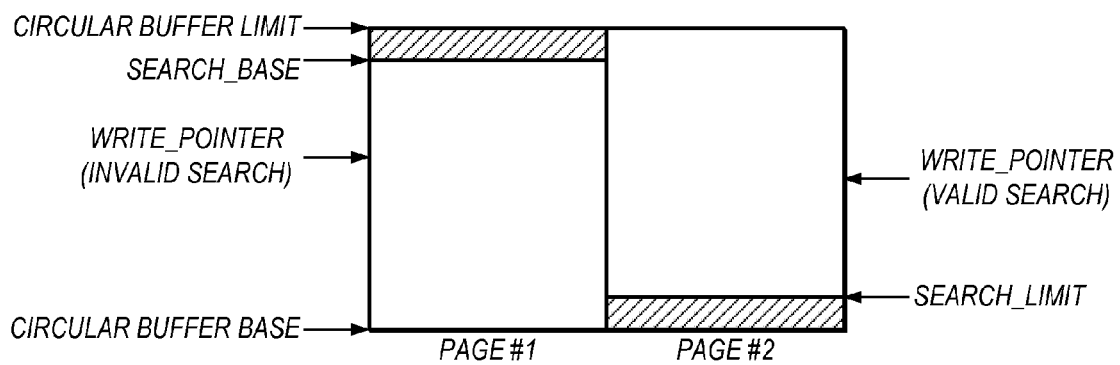
LINEAR/PAGE VIEW
FIG. 22

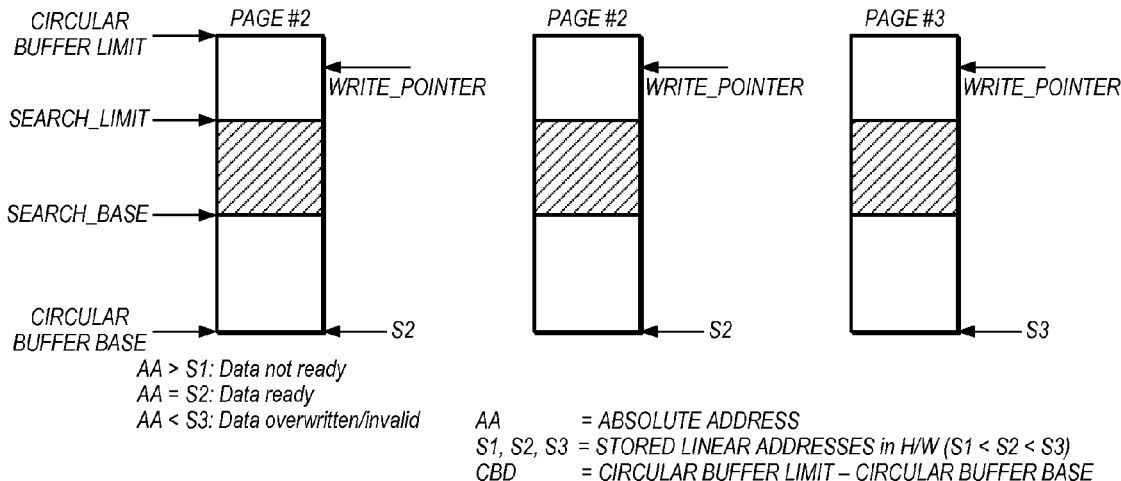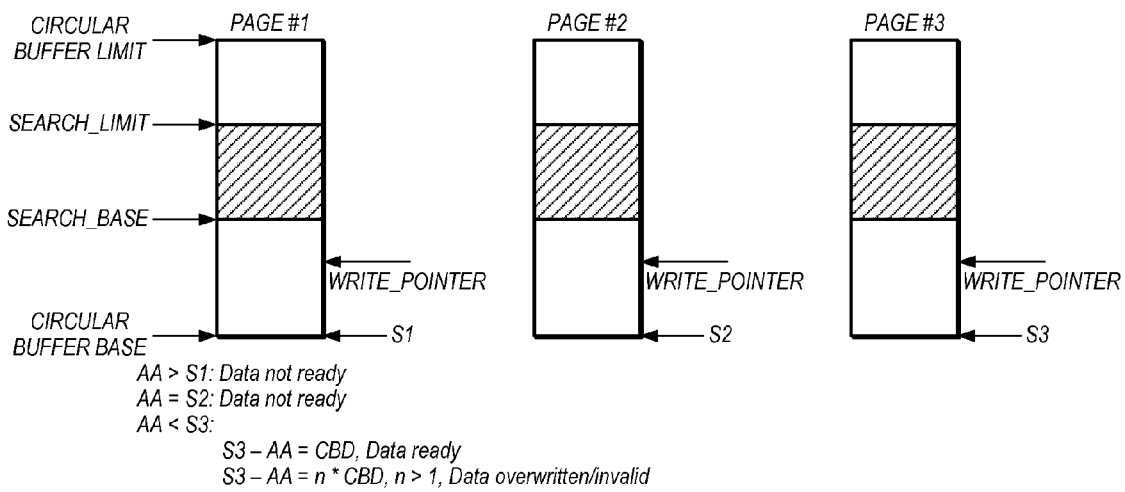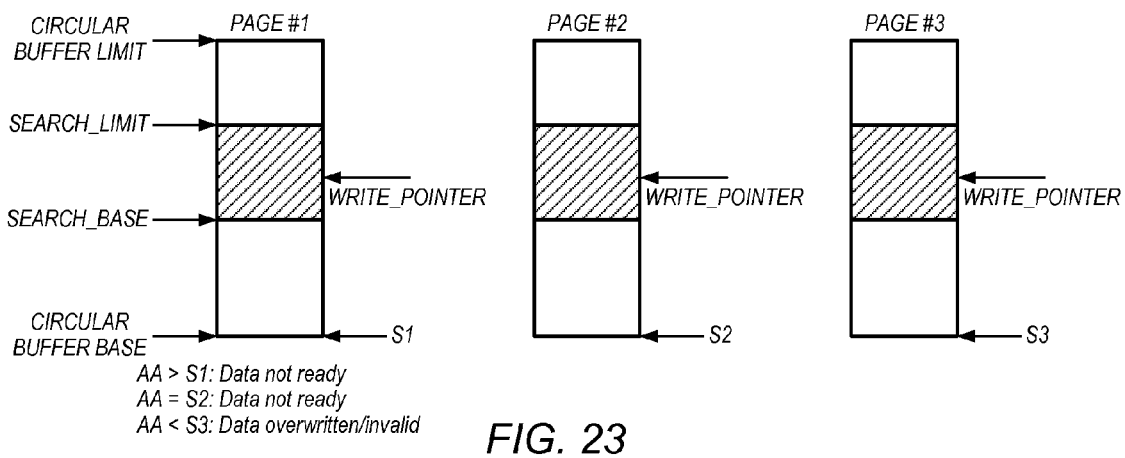
FIG. 23

Circular Buffer Manager State Machine

Note: PS_DONE can occur because of CB overflow, DPT/PRE/FFT errors or a successful PS completion signal as indicated by the FFT

SYSTEM AND METHOD FOR FACILITATING DATA TRANSFER USING A SHARED NON-DETERMINISTIC BUS

PRIORITY CLAIM

The present application claims benefit of priority to U.S. Provisional Application Ser. No. 61/438,234, titled "Data Transfer Subsystem", filed Jan. 31, 2011, whose inventors are Srinjoy Das, Philip Crary, and Alexander Raykhman, which is hereby incorporated by reference in its entirety as if set forth fully and completely herein.

BACKGROUND OF THE INVENTION

1. Field of the Disclosure

The present invention relates generally to data transfer.

2. Description of the Related Art

Global navigational satellite systems (GNSS) such as GPS and GLONASS have been in existence for many years. Initially, these technologies were typically deployed in stand-alone GNSS devices. However, more recently, with the increasing popularity of multi-functional wireless devices (such as smartphones, laptop computers, and/or other mobile devices), it is becoming desirable to implement GNSS functionality in multi-functional wireless devices. Multi-functional devices may offer the convenience of their multiple functions in a single device, and opportunities may exist for increased efficiency and compactness in terms of overall system design, however, there are significant challenges in optimizing individual functional groups which historically have most commonly been implemented in a stand-alone manner, such as GNSS, for use in a multi-functional device. Accordingly, improvements in the field would be desirable.

SUMMARY OF THE INVENTION

Embodiments of the invention may relate to use of a shared memory block by multiple functional blocks of a wireless device. The use of a shared memory block may have several advantages over the inclusion of discrete memory subcomponents in the functional blocks of the wireless device, potentially including more compact overall design, lower cost, and increased flexibility (e.g., by flexibly allocating memory resources to different functional blocks depending on need, priority, and/or other factors, particularly if memory access is via a non-deterministic bus), among other possible advantages. Embodiments of the invention may also relate to a novel functional block design which uses the shared memory resource in an efficient and effective manner. This may be used with respect to technologies which have typically been implemented as functional blocks with one or more local memory resources to which they have exclusive access. Embodiments of this disclosure thus relate to various novel aspects of functional block design.

One set of embodiments relates to a method for facilitating radio frequency (RF) data transfer between a functional block implementing a wireless technology and a non-local memory, and a system configured to implement the method. The non-local memory may be accessible via a non-deterministic bus, which may be shared with one or more other bus masters. The system may include an RF subsystem including an antenna for receiving RF data, one or more RF signal processing subsystems (e.g., digital signal processing (DSP) subsystems) configured to process the RF data, and a data transfer subsystem, which may be configured to implement the method. The method may be performed as follows.

A first RF data transfer request may be received from the RF subsystem. The first data transfer request may be a request that first RF data be transferred from the first RF subsystem to the non-local memory. The first RF data transfer request may have a first priority level.

A second RF data transfer request may be received from a first RF signal processing subsystem. The second RF data transfer request may be a request that second RF data be transferred between the first RF signal processing subsystem and the non-local memory. The second RF data transfer request may have a second priority level. The first priority level may be higher than the second priority level.

The first RF data transfer may be initiated. The first data transfer may be initiated before the second RF data transfer is initiated, e.g., based on the first priority level being higher than the second priority level.

In some embodiments, all RF data transfer requests associated with the RF subsystem may have the first priority. For example, the RF subsystem may receive RF data in real-time, and may have a highest RF data transfer priority level because it receives RF data in real-time. The first RF data transfer request may be associated with the first logic subsystem, and may have the first priority level based on this association.

In some embodiments, the method may include waiting, initially, in an idle state. In some embodiments there may be multiple types of idle states. For example, there may be a first idle state in which RF data transfer requests are not accepted. A second idle state, in which RF data transfer requests are received, may be transitioned to. The first and second RF data transfer requests may be received while in the second idle state.

In some embodiments, it may be determined that an exception (or error) has occurred. The exception (or error) may occur (and be determined to have occurred) at any time; for example, it may be determined that the exception has occurred after receiving the first and second RF data transfer requests and initiating the first RF data transfer request. There may be at least two types of exceptions (or errors). In some embodiments, if the exception is a first type of exception, any outstanding RF data transfer requests (e.g., the first RF data transfer request, if it has been initiated) may be completed and a transition to the first idle state may be made. If the exception is a second type of exception, a current RF data transfers causing the exception (and/or any current RF data transfers) e.g., the first RF data transfer request, if it has been initiated, may be terminated and a transition to the second idle state may be made. In some embodiments, an indication that the exception (or error) has occurred may be sent to at least one (or two, or more) of the logic subsystems.

The second RF data transfer may be initiated (e.g., if no exception or error has occurred) after the first RF data transfer has been initiated, e.g., because the second priority level is lower than the first priority level.

In some embodiments, the logic subsystems and the memory may be in different clock domains. Embodiments are envisioned in which the data transfer subsystem is part of a GNSS system, and the first and second data are GNSS data. Furthermore, embodiments are considered in which the functional block is configured to process both GPS and GLONASS RF data.

One set of embodiments relates to a method for improving throughput of data transfers between one or more logic subsystems and a memory, and a system configured to implement the method. The memory may be accessible via a non-deterministic bus, which may be shared with one or more other bus masters. The non-deterministic bus may utilize quality of service (QOS) timers for data transfer requests; for example, the non-deterministic bus may be configured to service data transfer requests based on the QOS timers. The system may include a data transfer subsystem, which may include control logic configured to implement the method. In some embodiments, one or both of the non-deterministic bus and the data transfer subsystem may be configured to transfer fixed length segments of data. The method may be performed as follows.

A first request that first data be transferred between a first logic subsystem and the memory may be received. A second request that second data be transferred between the first logic subsystem and the memory may be received. The first data and the second data may be associated. In some embodiments, the first and second data transfers may be transfers of data from the memory to the first logic subsystem, e.g., reads from the memory. Alternatively, the first and second data transfers may be transfers of data from the first logic subsystem to the memory, e.g., writes to the memory.

The first data transfer may be initiated in response to the first request. The second data transfer may be initiated in response to the second data transfer request. The second data transfer may be initiated before the first data transfer is completed. In some embodiments initiating the second data transfer before the first data transfer is completed may be based on the association between the first data and the second data.

Initiating the second data transfer may initiate a QOS timer for the second data transfer. In some embodiments, the second data transfer may be initiated at a determined time interval after initiation of the first data transfer. The determined time interval may be configured based on the QOS timer configuration of the non-deterministic bus. For example, the determined time interval may be configured such that, by the time the first data transfer is complete, the QOS timer for the second data transfer may be expected to have reached a level that the non-deterministic bus will service immediately. This may cause the second data transfer to be performed in immediate succession to the first data transfer.

The first and second requests may be received by the data transfer subsystem from the first logic subsystem. In some embodiments, the data transfer subsystem may further be configured to receive and initiate data transfer requests from one or more other logic subsystems.

In some embodiments, the data transfer subsystem may be part of a GNSS system, and the first and second data may be GNSS data.

One set of embodiments relates to a method for facilitating data transfer between one or more logic subsystems and a memory by managing the memory as a circular buffer, and a system configured to implement the method. The system may include a plurality of memory locations and control logic configured to implement the method. The method may be performed as follows.

A write location pointer may be maintained (e.g., in a first memory location). The write location pointer may indicate a location in the circular buffer which is currently being written to. Maintaining the write location pointer may include storing one or more values indicating a location (e.g., an address) in the memory. Maintaining the write location pointer may also include updating the one or more stored values as the current write location changes, in order to reflect the current write location.

A page pointer may be maintained (e.g., in a second memory location). The page pointer may indicate a page of the circular buffer which is currently being written to. Maintaining the page pointer may include storing one or more values indicating a currently written-to page. Maintaining the page pointer may also include updating the one or more stored values as the current page being written to changes, in order to reflect the current page.

A notification of a desired search range may be received. The desired search range may be a portion of the circular buffer through which a search (e.g., a read) is desired. The desired search range may comprise only locations on a single page of the circular buffer, or may include locations on a plurality of pages (e.g., two consecutive pages) of the circular buffer. The notification of the desired search range may indicate a search range base address and a search range limit address in the memory. The notification of the desired search range may also indicate a page number for at least one of the search range base address or the search range base address.

The validity of the desired search range may be determined. Determining the validity of the desired search range may be based on the search range, the write location pointer, and the page pointer. The desired search range may be determined to be valid if the entire search range has been written and none of it has been overwritten; e.g., if the entire search range is before the write location pointer on the current page and/or after the write location pointer on the previous page. The determined search range may also be determined to be valid if the desired search range includes the location indicated by the write location pointer on the page indicated by the page pointer; however, in this case, a notification to delay the search may be sent, e.g., because the desired search range includes an area of the circular buffer which has not yet been written.

In some embodiments, the page pointer may include a first page counter and a first page section indicator, e.g., indicating a page number and section which is currently being written. The desired search range may similarly include a second page counter and a second page section indicator, e.g., indicating a page number and section of the search/read which is desired. In such embodiments, determining the validity of the desired search range may include comparing the first page section indicator and the second page section indicator, and comparing the first page counter and the second page counter. If the first page section indicator and the second page section indicator are different, the comparison of the first page counter and the second page counter may be a signed comparison.

Embodiments are also considered in which a read location pointer may be maintained (e.g., in a third memory location) during a search of the circular buffer. The read location pointer may indicate a location in the circular buffer which is currently being read. In some embodiments, validity of the search of the circular buffer may be determined during the search of the circular buffer. The determination during the search may be based on the read location pointer and the search range limit address of the search, and in some embodiments may also be based on the write location pointer, and the page pointer.

In some embodiments, the control logic may further be configured to manage a second memory (which may be a second portion of the same memory) as a second circular buffer. For example, embodiments are envisioned in which the one or more logic subsystems may be (at least part of) a GNSS system, and the data stored in the memory may be GNSS data. In some of these embodiments, the system may be configured to utilize both GPS and GLONASS data, in which case a first memory (or a first portion of a memory) could be used for GPS data, while a second memory (or a second portion of the same memory) could be used for GLONASS data.

One set of embodiments relates to a method for facilitating data transfer from a first clock domain to a memory in a second clock domain, and a system configured to implement the method. The system may include a plurality of inputs, a memory, and control logic configured to implement the method. The method may be performed as follows.

First clock information may be received (e.g., at a first input) from the first clock domain. The first clock information may correspond to first data transferred from the first clock domain to the memory in the second clock domain.

The first data may be received in the first clock domain in real time. In some embodiments, on EPOCH may occur in the first clock domain as the first data is received in the first clock domain. The first clock information may thus include an EPOCH index number, indicating an EPOCH number of the EPOCH occurrence during reception of the first data in the first clock domain. The first clock information may further include a clock cycle number (according to the first clock domain) of the EPOCH occurrence.

First location information may be received (e.g., at a second input), indicating a location at which the first data is stored in the memory in the second clock domain. In some embodiments, the memory in the second clock domain may be configured as a circular buffer. In this case, the first location information might include an address in the memory in the second clock domain and a page number of the circular buffer at which the first data is stored.

First correspondence information for the first data may be stored (e.g., in a memory). The first correspondence information may include the first clock information and the first location information. In some embodiments, the first correspondence information may be stored in an address table. Additional correspondence information may also be stored in the address table. For example, second clock information and second location information corresponding to second data transferred from the first clock domain to the second clock domain might also be received and stored in the address table. In some embodiments, the first (and/or any additional) correspondence information may be stored based on an EPOCH occurrence during reception of the first (and/or additional) data in the first clock domain. In other words, in some embodiments correspondence information may only be stored for data for which an EPOCH occurred during reception of that data in the first clock domain.

In some embodiments, the first clock domain may include a free-running counter indicating an absolute system time in the first clock domain. Embodiments are considered in which an indicator of a first time according to the absolute system time in the first clock domain may be stored (e.g., in a memory). The EPOCH number indicated by the EPOCH index number may indicate a number of EPOCHs that have occurred since the first time according to the absolute system time in the first clock domain. The correspondence information (e.g., including an EPOCH index number and data storage location information) may thus link data in the non-local memory to the absolute system time in the first clock domain.

The first correspondence information may be used by one or more logic subsystems in the first clock domain to locate and retrieve data stored in the memory in the second clock domain.

In some embodiments, the control logic may be hardware control logic. The control logic may be part of the first clock domain. The system may also include a plurality of logic subsystems in the first clock domain. For example, it is envisioned that in some embodiments the first clock domain may include a processor and memory including program instructions executable by the processor for maintaining a mirrored version of the first correspondence information.

In some embodiments, the system may be (or may be part of) a GNSS system. The first data may thus include GNSS data. In addition, in some embodiments the first data may include part or all of the first clock information; for example, the first data may include information indicating a clock cycle in the first clock domain during which an EPOCH occurred.

The various sets of embodiments may be implemented in combination or may be implemented individually, as appropriate and desired.

BRIEF DESCRIPTION OF THE DRAWINGS

A better understanding of the present invention can be obtained when the following Detailed Description of the Embodiments is read in conjunction with the following drawings, in which:

FIG. 9 illustrates an exemplary exception handling procedure according to one embodiment;

FIG. 10 illustrates exemplary timing of serial and overlapping bus accesses according to one embodiment; and FIGS. 11-25 illustrate various features of a non-limiting exemplary implementation of the concepts of the disclosure.

Figure 1:
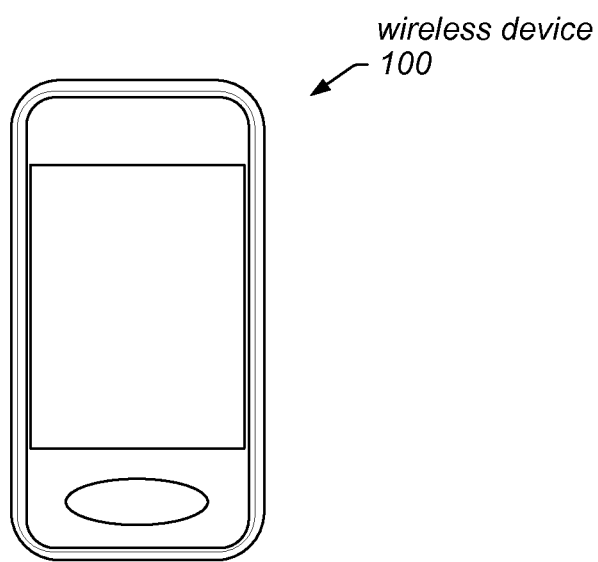
FIG. 1 illustrates an exemplary wireless device, according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS OF THE INVENTION

Incorporation By Reference

The following reference is incorporated by reference in its entirety as if set forth fully and completely herein:

U.S. application Ser. No. 12/570,942, titled "FFT Based Acquisition Techniques for Satellite Based Navigation Systems", filed Sep. 30, 2009, whose inventors are Philip Crary and Qinfang Sun.

GLOSSARY

The following terms used in this disclosure are understood to have the following meanings.

The term "memory medium" is intended to include any of various types of memory devices or storage devices, including, without limitation: an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

The term "computer system" is intended to include any of various types of computing or processing systems, including a personal computer system (PC), laptop computer, smartphone, personal digital assistant (PDA), mainframe computer system, workstation, network appliance, Internet appliance, grid computing system, or other device or combinations of devices. In general, the term "computer system" can be broadly defined to encompass any device (or combination of devices) having at least one processor that executes instructions from a memory medium.

The term "chip" is considered to have the full extent of its ordinary meaning, and includes an electronic device, e.g., a semiconductor device, that may be implemented in any of various ways, such as analog logic, digital logic, a processor and memory (such as a CPU, DSP, microcontroller, etc.), an ASIC (application specific integrated circuit), an FPGA (field programmable gate array), or any combination of the above.

The term "functional block", as used herein, refers to a portion of a device designed and/or configured to implement a particular function, e.g., enabling the device to perform that function. The term may be used in reference to a subsystem in a multi-functional device, or in reference to a system as a whole which implements a single function. Thus, for example, a multi-functional device might be considered to include functional blocks for a global navigational satellite system (GNSS), a Bluetooth adapter, a WLAN adapter, and a graphics card, among other possible functional blocks. A functional block may typically be implemented using logic or circuitry in any of various ways; some possibilities include one or more chips and/or IP blocks, and/or integration of functional circuitry into overall device design, or some combination of chip(s), IP block(s), and integrated circuitry. Functional blocks may in some cases interact and/or share components.

The term "EPOCH", as used herein, refers to a specific defined quantity of time. As one example, in GNSS systems, an EPOCH is defined as a period of time which is 1 ms long. System timing may be based at least in part on the defined length of an EPOCH in a given system. Other systems may use different specific lengths of time as the length of an EPOCH.

FIG. 1—Exemplary Wireless Device

FIG. 1 illustrates an exemplary wireless device 100, according to one embodiment. As shown in FIG. 1, the wireless device 100 may be a cell phone or smart phone or other similar mobile device (which may be classified as a mobile computing device). However, it should be noted that other wireless devices are envisioned, such as GPS devices, laptop, notebook, or netbook computers, personal digital assistants, multimedia players (portable or stationary), and/or other mobile devices/computing systems which are operable to use wireless communication.

The wireless device 100 may be configured to perform wireless communication (e.g., radio frequency (RF) communication) in one or more ways. For example, the wireless device 100 may be configured with one or more of global navigational satellite system (GNSS) (such as GPS and/or GLONASS), Bluetooth, Wi-Fi (IEEE 802.11, also referred to as WLAN), and/or cellular telephone functionality, among other possible functionalities.

In some embodiments, the wireless device 100 may also include any of a variety of other possible capabilities. For example, the wireless device 100 may include any or all of: display functionality (e.g., for displaying alphanumeric characters, pictures, video, and/or other display functionality); still photography and/or video capture functionality; audio functionality (e.g., for capturing and/or presenting voice, music, and/or other audio inputs and/or outputs); and a keyboard, mouse and/or other touch sensitive functionality, among others.

Figure 2:
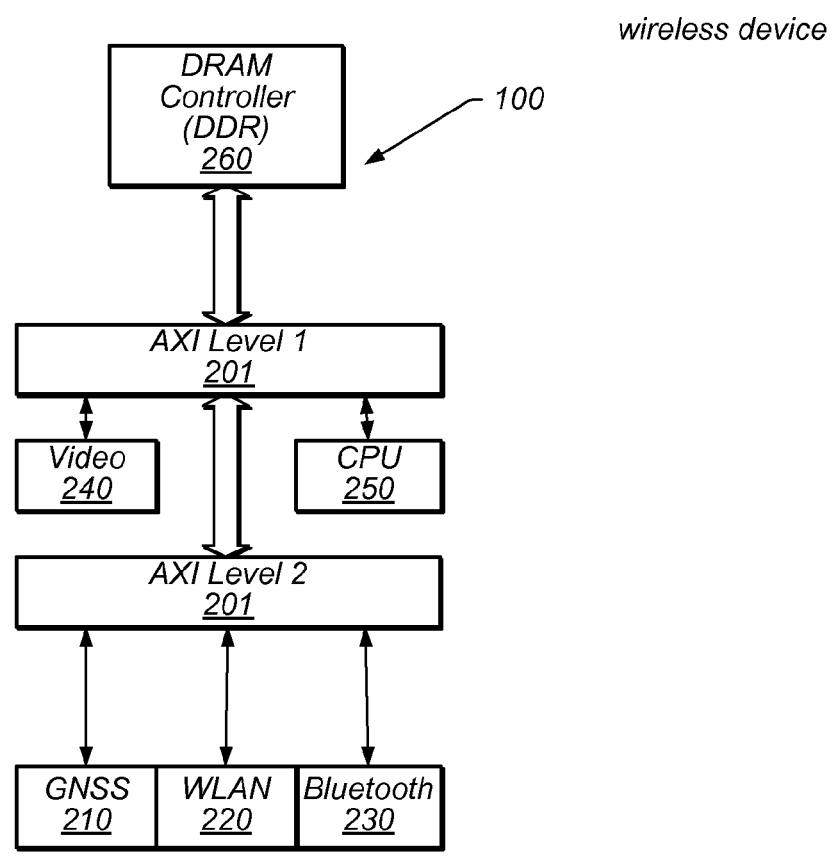
FIG. 2 is an exemplary block diagram of selected internal components of a wireless device, according to one embodiment.

FIG. 2—Exemplary Block Diagram of the Wireless Device

As previously noted, the wireless device 100 may include a wide variety of functional components according to various embodiments. FIG. 2 illustrates a portion of the internal functional blocks of one exemplary implementation of a wireless device 100. It will of course be understood that the implementation shown in FIG. 2 is a non-limiting example of one possible implementation of wireless device 100, and that numerous other implementations (e.g., including different functionality or different functional grouping with the same functionality) are also envisioned and should be considered within the scope of this disclosure.

According to various embodiments, the functional blocks shown in FIG. 2 may include logic or circuitry and may be implemented in any of various ways, such as analog logic, digital logic, a processor and memory (such as a CPU, DSP, microcontroller, etc.), an ASIC (application specific integrated circuit), an FPGA (field programmable gate array), or any combination of the above.

In some embodiments, one or more of the functional blocks may be implemented as individual (e.g., discrete) chips and/or circuit boards. Combinations of multiple functional blocks (or portions of multiple functional blocks) into a single chip, and/or use of multiple chips to implement a single functional block, are also envisioned.

Wireless device 100 may include a bus system, such as AXI bus 201. The bus system may provide communicative access between the functional blocks coupled to the bus. Thus, each of GNSS 210, WLAN 220, Bluetooth 230, Video card 240, and CPU 250 may have access to a shared memory (e.g., DDR DRAM memory, as shown) via memory controller 260 via AXI bus 201.

In some embodiments, each of the functional blocks may be allocated a portion of the shared memory. The allocated portions may be fixed or flexible according to various embodiments.

The bus may in some embodiments be non-deterministic. In other words, the access to the bus by the various functional blocks may not be scheduled in a regular/repeating manner, but may rather be request-based and may be arbitrated based on various factors such as priority, quality of service (QOS) timers or other indicators, and/or any of a variety of other factors.

Use of a shared memory block in wireless device 100 may have several advantages over including discrete memory subcomponents in the functional blocks of the wireless device, potentially including more compact overall design, lower cost, and increased flexibility (e.g., by flexibly allocating memory resources to different functional blocks depending on need, priority, and/or other factors, particularly if memory access is via a non-deterministic bus), among other possible advantages. However, for technologies which have typically been implemented as functional blocks with one or more local memory resources to which they have exclusive access, this may require a novel functional block design in order to use a shared memory resource in an efficient and effective manner. Some embodiments of this disclosure relate to such novel aspects of functional block design.

Figure 3:
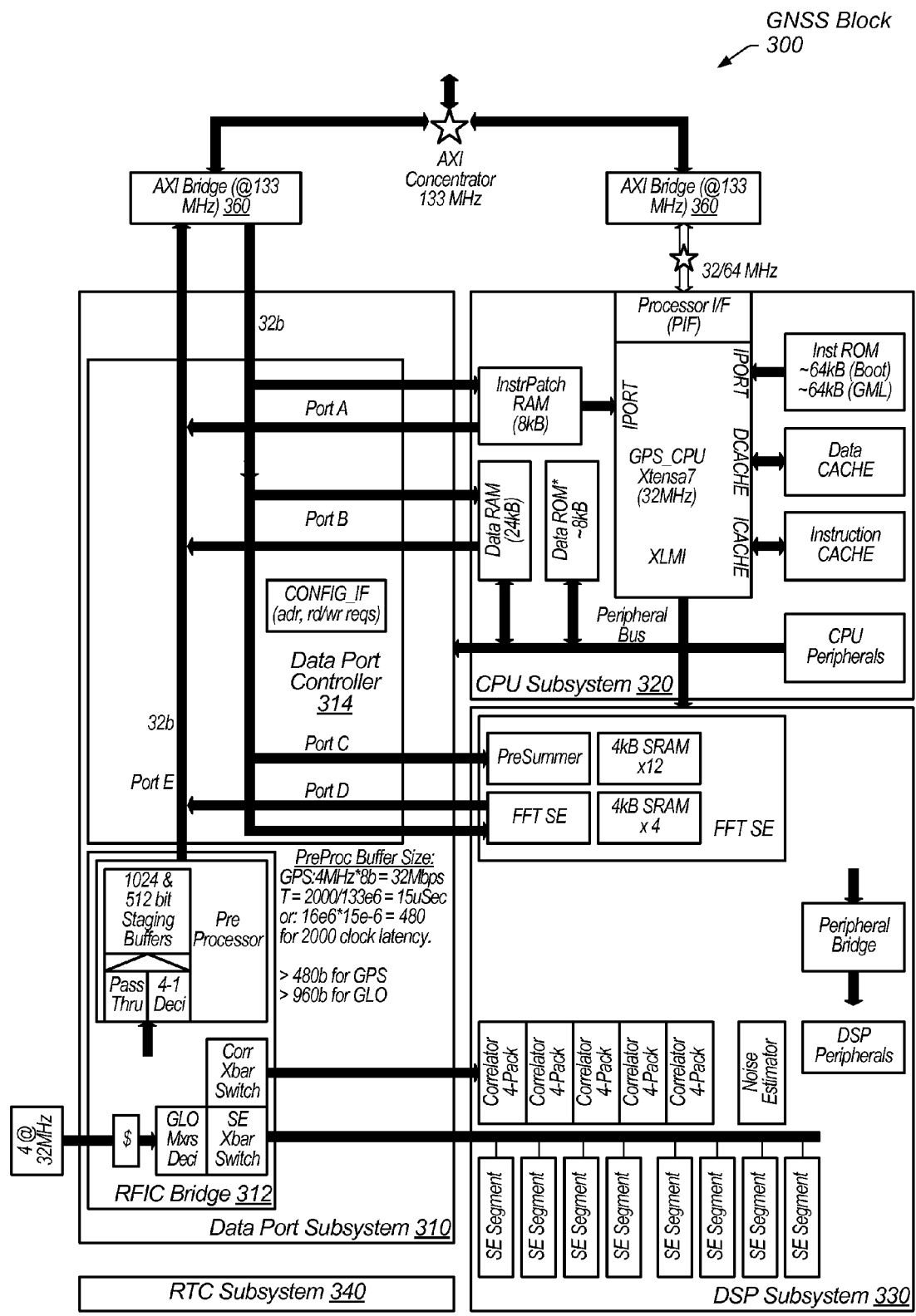
FIG. 3 is a more detailed exemplary block diagram of a GNSS block for use in a wireless device such as shown in FIGS. 1 and 2, according to one embodiment.

FIG. 3—GNSS subsystem

As noted with respect to FIG. 2, sharing a memory resource by a functional block of a mobile device may introduce several challenges relative to implementing exclusively non-shared memory resources. This may particularly be the case if access to the shared memory resource is via a non-deterministic bus. Additional challenges may be introduced if the shared memory is not in the same clock domain as a functional block which uses the shared memory.

FIG. 3 is a block diagram illustrating a functional block implementing a global navigational satellite system (GNSS) as one possible example of such a functional block designed to use a shared memory resource. It should be noted, however, that embodiments relating to any of a variety of functional blocks implementing any of a variety of technologies are also envisioned, and that the present disclosure should not be considered limited to GNSS subsystems.

The GNSS block 300 shown in FIG. 3 may be designed for use in a mobile device, such as mobile device 100 shown in FIGS. 1 and 2. For example, GNSS block 210 shown in FIG. 2 may be implemented as GNSS block 300 shown in FIG. 3. GNSS block 300 may alternatively be implemented in any of a variety of mobile device designs; it should further be noted that although the GNSS block 300 shown in FIG. 3 is illustrative of one possible implementation of a GNSS block for use in a mobile device, other GNSS blocks are also envisioned.

According to some embodiments, GNSS block 300 may be implemented as a chip for use in a mobile device. Alternatively, if desired, the GNSS block 300 may be an IP block implemented within a larger system, e.g., including multiple functional blocks or portions thereof.

The GNSS block may include a plurality of logic subsystems. For example, the GNSS block may include a dataport subsystem 310, a CPU subsystem 320, a DSP subsystem 330, and an RTC subsystem 340.

In some embodiments, the GNSS block may be configured to support multiple data processing modes. For example, the GNSS block may be configured to support a "playback" processing mode, in which received RF GNSS data is stored and processed in a flexible manner, and a "realtime" processing mode in which received RF GNSS data processed as it is received, i.e., substantially in real-time. Embodiments of the disclosure may relate primarily to the playback processing mode, however, elements of the GNSS block used for real-time data processing mode are also shown in FIG. 3 for completeness.

During "playback" processing mode, the CPU subsystem 320, the PreSummer and FFT components within the DSP subsystem 330, and the RFIC bridge 312 within the data port subsystem 310 may all be configured to transfer data to and/or from off-block memory 350. The data port controller 314 may be configured to arbitrate these data transfers, e.g., via AXI bridge 360, as shown. The data port controller 314 is described in further detail according to one set of embodiments with respect to FIG. 4.

Figure 4:
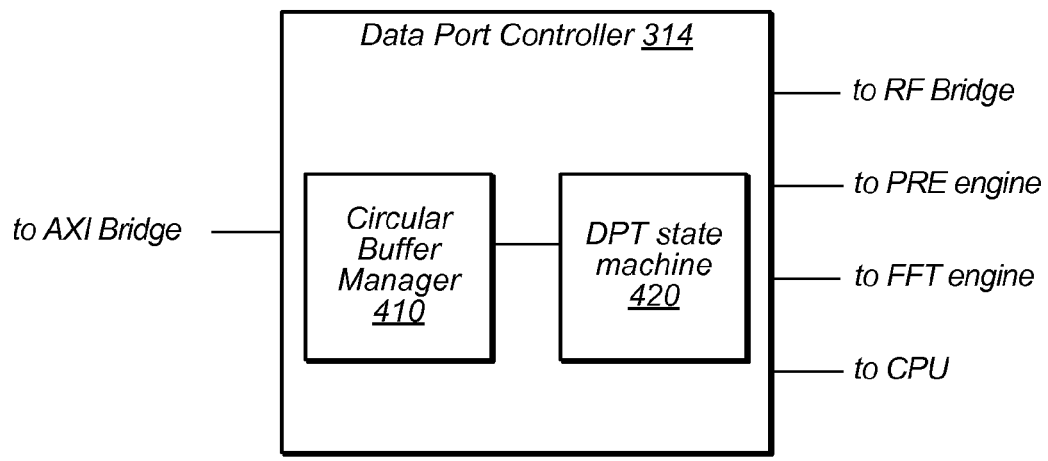
FIG. 4 is a block diagram illustrating components of a Data Port Controller block within a GNSS block such as shown in FIG. 3, according to one embodiment.

FIG. 4—Data Port Controller

FIG. 4 is a block diagram illustrating a data port controller (e.g., data port controller 314 of FIG. 3) sub-block of a GNSS block, such as GNSS block 300 shown in FIG. 3, according to one embodiment. The data port controller (DPT) may be designed primarily to support playback processing of GNSS RF data by PRE and FFT DSP engines. The memory system used by both these blocks may reside outside the GNSS block. As one example, the memory may be a DDR DRAM attached to an AXI bus, such as shown in FIG. 2. Alternate types of memory and buses are also envisioned.

The off-block nature of the memory may necessitate a translation of Fast-Fourier Transform (FFT) based searches from the GNSS receiver clock domain (MCLK) to the bus (e.g., the bus used to access the memory) domain (BCLK). In addition, the performance of the GNSS block may also be improved if the memory is managed as a circular buffer. According to some embodiments, circular buffer manager (CBM) 410 may be configured to overcome these challenges to data transfer between the GNSS block and an off-block shared memory, e.g., according to the methods described with respect to FIGS. 7-8, or variations thereof.

In addition, a certain level of flexibility in data transfer algorithms may be required if the memory and bus are also accessible by other system blocks, particularly if access to the bus is non-deterministic in nature. According to some embodiments, DPT state machine 420 may be configured to flexibly facilitate data transfer between the GNSS block and an off-block shared memory to meet this challenge, e.g., according to the methods described with respect to FIGS. 5-6, or variations thereof.

FIGS. 5-8—Flowchart Diagrams

FIGS. 5-8 are flowchart diagrams illustrating algorithms for a functional block (e.g., GNSS) utilizing memory resource according to various conditions. It should be noted that the methods illustrated by the flowcharts of FIGS. 5-8 may be implemented individually or in any combination, as desired, according to various embodiments. While the steps described below are shown in a certain order, it should be noted that, according to various embodiments, one or more of the steps may be omitted, repeated, or performed in a different order than shown.

Figure 5:
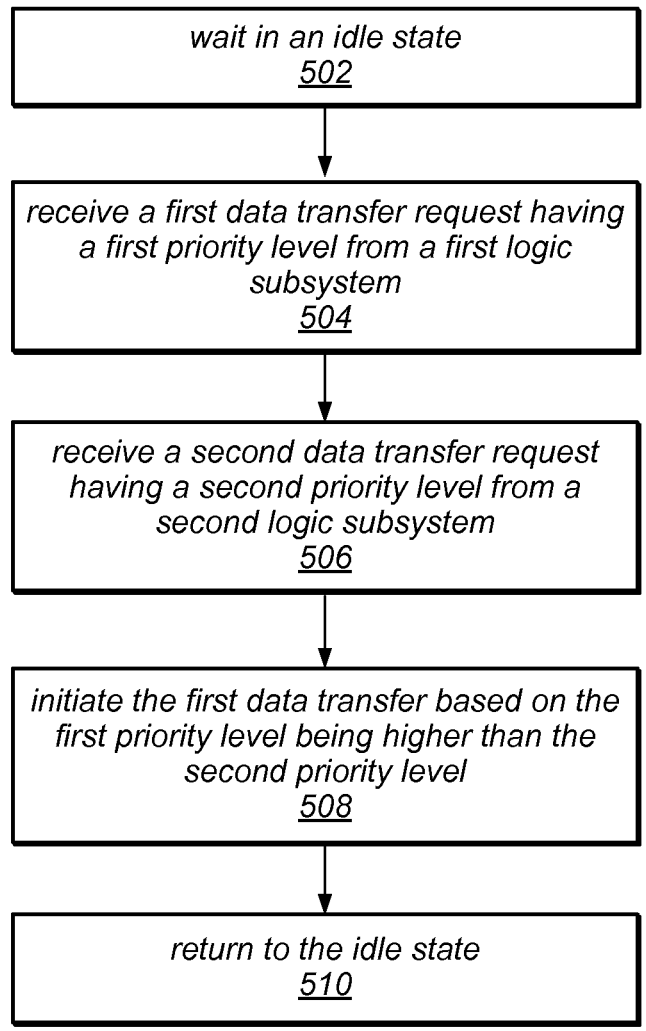
FIGS. 5-8 are flowchart diagrams illustrating embodiments of methods for facilitating data transfer according to various conditions.

FIG. 5 is a flowchart diagram illustrating a method for facilitating data transfer between a plurality of logic subsystems and a memory, and more particularly in a case in which the memory is accessible via a non-deterministic bus which is shared with one or more other bus masters. The method may be implemented by control logic comprised in a data transfer subsystem. In some embodiments, the control logic may be implemented as a finite state machine implemented in hardware.

Because the data transfer subsystem may have limited access to the non-deterministic bus (i.e., due to other bus masters also requesting accessing the memory), the data transfer subsystem should be designed in such a way that it meets the needs of all of the various logic subsystems for which the data transfer subsystem facilitates data transfer. It may frequently be the case that different logic subsystems have different frequencies with which they will want to access the memory, and/or different consequences attached to not being able to access the memory in a timely manner. For example, in the exemplary GNSS which is described further with respect to FIGS. 11-25, the RF data being received in real time may need to be transferred to the memory less frequently than the PreSummer and FFT subsystems (e.g., because of a FIFO buffer buffering the data between transfers, and/or because the PreSum and FFT engines may read the same data repeatedly), but there may be a higher cost if the RF data is not transferred in a timely manner, because real-time data may be lost. Accordingly, the data transfer subsystem may assign different priority levels to different logic subsystems, thereby prioritizing data transfers to make effective use of its limited access to the shared memory.

Furthermore, it may be very important that the data transfer subsystem deal gracefully with situations in which errors and/or exceptions occur. For example, errors and exceptions may be inevitable to a certain degree if access to the shared memory is limited, as on some occasions the data transfer subsystem may simply not be able to access the shared memory in a timely enough manner to avoid buffer overflow or other such problems.

In 502, the system may initially wait in an idle state. In some embodiments, the system may include multiple idle states; for example, the system may include a first idle state or a "fully idle" state in which data transfer requests are not being accepted, and a second idle state or a "ready idle" state in which no data transfer requests are pending but the system is ready to accept data transfer requests. The system may transition from the fully idle state to the ready idle state once the system is ready to receive data transfer requests.

In 504, a first data transfer request having a first priority level may be received from a first logic subsystem. The first data transfer request may be a request that first data be transferred between the first logic subsystem and the memory. For example, the first data transfer request may be a request that the first data be transferred from the first logic subsystem to the memory, or from the memory to the first logic subsystem. In some embodiments, the first logic subsystem may be an RF subsystem that receives RF data in real time, and the first data transfer may be a transfer of RF data from the RF subsystem to the memory.

In 506, a second data transfer request having a second priority level may be received from a second logic subsystem. The second data transfer request may be a request that second data be transferred between the second logic subsystem and the memory. For example, similar to the first data transfer request, the second data transfer request may be a request that the second data be transferred from the second logic subsystem to the memory, or from the memory to the second logic subsystem. In some embodiments, the second logic subsystem may be an RF signal processing subsystem configured to process RF data received by the RF subsystem and stored in the memory. In some embodiments, the first priority level may be higher than the second priority level.

In 508, the first data transfer may be initiated. Initiating the first data transfer (e.g., as opposed to the second data transfer) may be based on the first priority level being higher than the second priority level. In some embodiments, the first data transfer request may have the first priority level because the first logic subsystem has the first priority level, e.g., because the first data transfer request is associated with the first logic subsystem. The priority levels may be assigned based on the relative importance of timely data transfer to the different logic subsystems. For example, an RF subsystem receiving data in real-time may be assigned a highest data transfer priority level because the RF data may be lost if it is not transferred in a timely manner.

In some embodiments, the second data transfer may also be initiated after the first data transfer is initiated.

In some embodiments, it may be determined that an exception and/or an error has occurred. An exception or error may occur during a data transfer, e.g., during the first data transfer or the second data transfer, or may occur when no data transfer is occurring. Exceptions and errors may have a variety of causes and the system may be designed to deal with different exceptions and errors in different ways. In some embodiments, there may be at least two types of errors or exceptions; for example, a set of embodiments is envisioned in which 'critical errors' and 'fatal errors' are defined and may be dealt with as described below.

According to some embodiments, if it is determined that a fatal error has occurred, any current data transfers may be completed, following which the system may be placed into a fully idle state. In some embodiments, the system may be held in the fully idle state until the error condition is lifted, at which point it may transition to the ready idle state. Examples of possible fatal errors include RF buffer overflow (i.e., real-time RF data overflowing its temporary buffer and overwriting data which has not yet been transferred to the shared memory), an off-block request that the functional block cease use of the bus (e.g., if the functional block is being disabled by a user of a mobile device in which the functional block is located), and/or other errors, according to various embodiments.

If it is determined that a critical error has occurred, the system may discontinue the data transfer request causing the critical error and return to the ready idle state. Alternatively, the system may complete any current data transfers before returning to the ready idle state. In this case, other data transfer requests may continue to be serviced. A critical error might be caused by a data transfer request for data that has been determined to not be valid. For example, if the shared memory is a circular buffer and it is determined that the data transfer request is for stale data that has already been overwritten, this could cause a critical error. Other critical errors are also possible.

In some embodiments, if an error or exception does occur, the system may send an indication to one or more of the logic subsystems that the error or exception has occurred. For example, FIG. 9 illustrates a possible exception handling procedure in an exemplary embodiment in which a dataport subsystem facilitates data transfers between at least two DSP logic subsystems (e.g., a PreSum subsystem and a FFT subsystem) and a shared memory. In this case, an indication of an error/exception may be received by the dataport subsystem from one of the DSP subsystems (e.g., the PreSum subsystem, as shown, or another logic subsystem). The dataport subsystem may then broadcast the error/exception (or an indication thereof) to all DSP subsystems (e.g., both the PreSum and the FFT subsystems, in the illustrated embodiment).

In 510, the system may return to (one of) the idle state(s). This may occur based on an exception occurring or during normal operation. For example, as noted above, a fatal error may result in a return to a first (fully) idle state, while a critical error may result in a return to a second (ready) idle state; in addition, after completing any outstanding data transfer requests successfully, the system may similarly transition to the second (ready) idle state.

Figure 6:
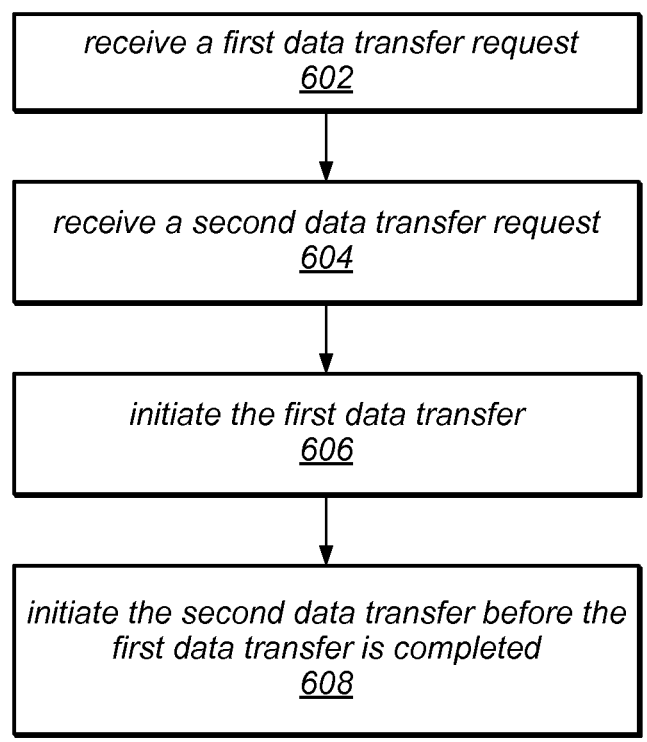
Figure 7:
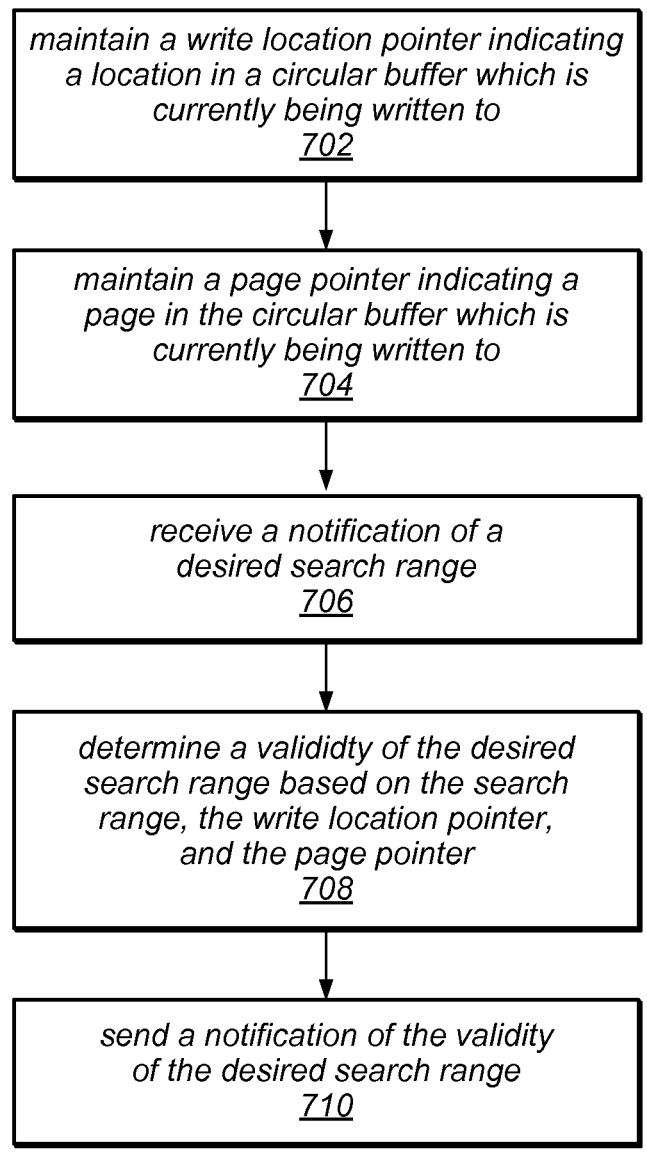
Figure 8:
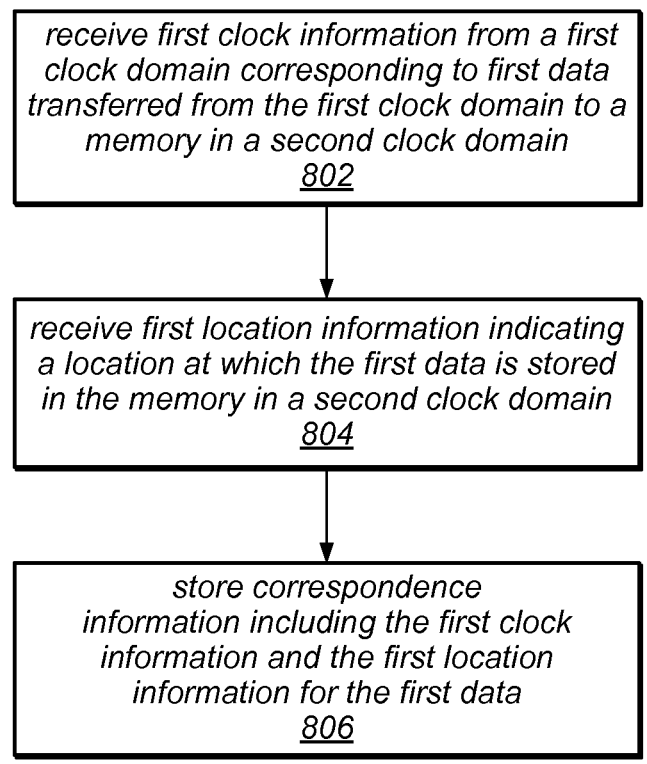

As noted above, the method may also be performed in combination with any of the methods described with respect to FIGS. 6-8. Thus, for example, in some embodiments, the logic subsystems and the memory may reside in different clock domains, among other possibilities.

FIG. 6 is a flowchart diagram illustrating a method for improving throughput of data transfers with a shared memory on a non-deterministic bus. Access to the non-deterministic bus may be shared with at least one other bus master (e.g., in another functional block). More specifically, FIG. 6 relates to a method for advantageously utilizing quality of service (QOS) timers in order to schedule back-to-back transfers of data in situations in which a specific logic subsystem is requesting two successive data transfers. One example of such a situation may occur in the exemplary GNSS implementation described with respect to FIGS. 11-25. In this case the bus may be AXI, which utilizes QOS timers and on which data transfers may typically be of a fixed length (e.g., one "word"). The data transfer subsystem may accordingly be configured to transfer fixed length segments of data (e.g., one word segments). It may also be typical for the PreSum engine to desire to read the two words at a time, or for the FFT engine to desire to read or write two words at a time. In this case, causing the two words to be read or written in immediate succession would improve throughput, thereby improving overall system performance.

The method illustrated in FIG. 6 may be implemented by control logic comprised in a data transfer subsystem. In some embodiments, the control logic may be implemented as a finite state machine implemented in hardware. In some embodiments, the finite state machine may also implement some or all aspects of the method of FIG. 5.

In 602, a first data transfer request may be received. The first data transfer request may be received from a first logic subsystem of a plurality of logic subsystems. The first data transfer may request that first data be transferred between the first logic subsystem and the memory.

In 604, a second data transfer request may be received. The second data transfer request may be received from the first logic subsystem of a plurality of logic subsystems. The second data transfer may request that second data be transferred between the first logic subsystem and the memory. In some embodiments, the first and second data transfer requests may be received simultaneously or in immediate succession, and/or may be configured for simultaneous or immediately successive performance. In some embodiments, the first data and the second data may be associated. For example, the first data and the second data may be configured for use together by the first logic subsystem and/or other logic subsystems in the system.

In a similar vain, it should be noted that in some embodiments both the first and second data transfers may be transfers of data from the first logic subsystem to the memory, or both the first and second data transfers may be transfers of data from the memory to the first logic subsystem. In other words, the first and second data transfers may either both be reads or both be writes; that is, both may transfer data in the same "direction".

In 606, the first data transfer may be initiated.

In 608, the second data transfer may be initiated. The second data transfer may be initiated before the first data transfer is completed. Initiating the second data transfer before the first data transfer is completed may, in some embodiments, be based on the association between the first data and the second data.

Initiating the second data transfer may initiate a QOS timer for the second data transfer. In some embodiments the second data transfer may be initiated at a determined time interval after initiation of the first data transfer. The determined time interval may be configured based on the settings of the QOS timer of the bus. For example, the determined time interval may be configured such that when the first data transfer is completed, the QOS timer for the second data transfer request has been running for a sufficient period of time to indicate to the bus that the second data transfer request should be serviced. In other words, initiating the second data transfer before the first data transfer is completed may cause the second data transfer to be performed in immediate succession to the first data transfer.

In some embodiments, the phrase "immediate succession" means that the second data transfer is started after the first data transfer completes without any intervening operations (e.g., data transfers to/from the memory either via the data transfer subsystem or by another bus master) and without any (or as much) set-up time that would normally be required for the second data transfer to start. This lack of need for set-up time for the second data transfer to start may be due to the initiation of the second data transfer prior to the first transfer completing, and may more specifically be due to the specific determined time interval after initiation of the first data transfer at which the second data transfer is initiated. FIG. 10 illustrates one exemplary embodiment in which the bus is an AXI bus. In this case, overlapping AXI accesses may require as few as 34 clock cycles from completion of the first data transfer until completion of the second data transfer. This may represent a reduction of 32% in the amount of time to complete the second data transfer, relative the case of serial AXI accesses, in which 50 clock cycles may typically be required between completion of the first data transfer and completion of the second data transfer. Other amounts of time for serial and/or overlapping bus accesses may be typical in other embodiments (e.g., either with an AXI bus or another bus type).

The first and second data transfer requests may both be received from the first logic subsystem. In some embodiments, the data transfer subsystem may also be configured to receive and initiate data transfer requests (e.g., in a similar manner, in order to advantageously utilize QOS timers to perform two data transfers in immediate succession) from one or more other logic subsystems.

Embodiments are further envisioned in which additional data transfer requests (e.g., a third data transfer request that third data associated with the first and second data be transferred between the first logic subsystem and the memory) may be received and initiated by the data transfer subsystem in a similar manner, thereby causing the additional data transfer request(s) to be performed in immediate succession to the second data transfer.

FIG. 7 is a flowchart diagram illustrating a method for facilitating data transfer between logic subsystems and a memory by managing the memory as a circular buffer. In some embodiments, the memory may be a shared memory accessible by a non-deterministic bus, as in the methods of FIGS. 5-6, although other types of memory are also envisioned. In some embodiments, only a portion of the memory may be managed as a circular buffer; for example, a specific portion of the memory may be allocated for management as a circular buffer. The method may be implemented by a system including control logic configured to perform the method. In some embodiments, the control logic may be implemented in hardware, and may include one or more finite state machines.

Managing a memory as a circular buffer may allow for continuous writing to the memory; for example, once the end of the memory has been written to, the beginning of the memory may be overwritten. Each time this occurs it may be recorded as a new 'page'.

In some embodiments, the memory may be configured to be written to by a first logic subsystem and read from by one or more other logic subsystems. As one example, in the GNSS case described further with respect to FIGS. 11-25, the RF subsystem may write raw RF data (e.g., via a local FIFO buffer) to the circular buffer, while software (e.g., a processor executing program instructions comprised on a tangible local memory) may perform searches on (e.g., reads of) the RF data in the circular buffer. Part of managing the memory as a circular buffer may accordingly require keeping track of where in the circular buffer writing is occurring in real-time, and using this information to determine whether a desired search range (i.e., a region of the circular buffer) contains current data or not. The method may be performed as follows.

In 702, a write location pointer may be maintained. The write location pointer may indicate a location in the circular buffer which is currently being written to. Maintaining the write location pointer may include storing one or more values indicating the write location in a memory, such one or more hardware registers. Maintaining the write location pointer may also include updating the one or more values used as the write location pointer as the location which is currently being written to in the circular buffer changes.

In 704, a page pointer may be maintained. The page pointer may indicate a page in the circular buffer which is currently being written to. Similar to maintaining the write location pointer, maintaining the page pointer may include storing one or more values indicating the page in a memory, such as one or more hardware registers. Maintaining the page pointer may also include updating the one or more values used as the page pointer as the page which is currently being written to in the circular buffer changes.

In one set of embodiments, the page pointer may include a page counter (a "write page counter") and a page section indicator (a "write page section indicator"). The write page counter may be a counter of any of a variety of possible sizes. For example, embodiments are envisioned in which the write page counter counts up to 128; other sizes are also envisioned. After the upper boundary of the write page counter is reached, the write page counter may roll over and begin again. The write page section indicator may in some embodiments be stored as a single bit that toggles (e.g., between 0 and 1) every time the write page counter rolls over. Other types of write page section indicators are also considered.

In 706, a notification of a desired search range may be received. The notification of the desired search range may be received from a logic subsystem which desires to read the data stored in the desired search range. For example, in an exemplary GNSS implementation (described further with respect to FIGS. 11-25), software (e.g., a local processor/memory subsystem) may desire to process a portion of RF data stored in the circular buffer, and may send the notification to the control logic implementing the method.

The desired search range may be a portion of the circular buffer to be searched (e.g., read). Thus, the notification of the desired search range may indicate the portion of the circular buffer to be searched. For example, the notification may include a search range base address and a search range limit address in the memory, and may also indicate a page number for one or both of the search range base address and the search range limit address. According to some embodiments, the search range may include only locations on a single page of the circular buffer, or may include locations on a plurality of pages (e.g., consecutive pages) of the circular buffer. These may be referred to as type-1 and type-2 searches respectively, and are described further according to the exemplary specific embodiments of FIGS. 11-25 with respect thereto.

In some embodiments, the page value included in the desired search range may include a page section indicator (a "read page section indicator") in addition to a page counter value (a "read page counter value"). The read page counter value and read page section indicator may be in the same format as the write page counter and write page section indicator in some embodiments, and may accordingly be comparable (e.g., as part of determining validity of the desired search range, as will be subsequently described).

In 708, a validity of the desired search range may be determined. The validity of the desired search range may be determined based on the search range, the write location pointer, and the page pointer. A desired search range may be considered valid if the data in the search range is current. For example, a search range which begins and ends at locations before the location indicated by the write location pointer and on the same page indicated by the page pointer, and/or after the write location pointer on the page before the page indicated by the page pointer, may be valid. In contrast, a search range which begins at a location before the location indicated by the write location pointer and more than one page previous to the page pointer, at least a portion of the desired search range may include data which has already been overwritten, so the search range may be determined to be invalid.

In some embodiments, determining the validity of the desired search range may include comparing the write page counter value with the read page counter value. If they are the same value, or in some cases within one count of each other (e.g., if the write page counter value is one ahead of the read page counter value, and the search range base address is ahead of the write pointer), the desired search range may typically be determined to be valid.

A unique case in determining the validity of the desired search range may arise when the write page counter value and the read page counter value are in different page sections. In this case, a non-signed comparison may indicate that the desired search range is invalid even if it is valid. Thus, in some embodiments, if the page section indicator maintained as part of the page pointer and the page section indicator included in the desired search range are different, the comparison of the write page counter and the read page counter may be a signed comparison. Validity of the desired search range may thus be accurately determined even across page section boundaries, provided the difference in page tracking between the logic subsystem from which the desired search range is received and the page pointer do not diverge in their page tracking by a greater value than the size of the page counters.

In 710, a notification of the validity of the desired search range may be sent. The notification may be sent to the logic subsystem from which the notification of the desired search range was received. Based on the notification, the logic subsystem may then read from the desired search range (e.g., if the notification indicates that the desired search range is valid) or may abort the search (e.g., if the notification indicates that the desired search range is invalid).

A special case may occur if a search range begins and/or ends after the current write location (e.g., as indicated by the write location pointer and the page pointer); in this case the search range may not yet be valid. In some embodiments, in this case it may simply be determined that the desired search range is invalid. However, one other possible approach could include sending a notification (e.g., to the notifying logic subsystem) to delay searching the desired search range, i.e., in order that the desired search range may be written to and become valid. Alternatively, sending of a notification of the validity of the desired search range may simply be delayed until the desired search range becomes valid. A further or alternative sub-case may be possible if the search range begins in a valid location but ends in a location that has not yet been written. In this case, the desired search range may be determined to be valid, even though only part of the desired search range may be valid at the time. This may make sense if it is to be expected that the current write location will stay ahead of the subsequent search of the desired search range (e.g., if writing occurs faster than reading).

In some embodiments, a read location pointer may be maintained, e.g., during a search of the circular buffer. The read location pointer may indicate a location in the circular buffer which is currently being read. Maintaining the read location pointer may serve to avoid falsely determining that a search range has become invalid during a search. For example, in some embodiments, validity of a search may be determined (e.g., confirmed) during the actual search. If the validity check during the search of the circular buffer were to continue to use the search range base address after the write location pointer indicated that that location was being overwritten, an invalid search range result would be returned. However, if the read location is still after the write location, the effective (e.g., remaining) search range is actually still valid. Thus, in some embodiments, determining validity of a search of the circular buffer during the search may be based on the read location pointer, the search range limit address, the write location pointer, and the page pointer.

In some embodiments, the control logic may further be configured to manage a second memory (or portion of a memory) as a second circular buffer. For example, a GNSS system is envisioned in which both RF GPS data and GLONASS data may be received, and in which the RF GPS data is stored in a first circular buffer while RF GLONASS data is stored in a second circular buffer. The first and second circular buffers may be different portions of a single memory (e.g., a shared off-block memory such as described with respect to one or more of FIGS. 5, 6, and/or 8), or may be different memories, as desired. Management of additional memory portions as additional circular buffers is also envisioned.

FIG. 8 is a flowchart diagram illustrating a method for facilitating data transfer from a first clock domain to a memory comprised in a second clock domain. The method may be implemented by a system including control logic configured to implement the method. According to some embodiments, the control logic may be implemented as hardware. The system may be included within the first clock domain. The system may further include a plurality of logic subsystems.

The method of FIG. 8 may be used in the case where one or more logic subsystems within a first clock domain (e.g., on a first chip) utilize a memory resource which is within a second clock domain (e.g., not on the first chip). The method may serve to link first clock domain information to data transferred from the first clock domain to the second clock domain, thereby allowing the logic subsystems in the first clock domain to subsequently locate and retrieve data stored in the memory despite the clock domain boundary.

In 802, first clock information may be received. The first clock information may be from the first clock domain and may correspond to first data transferred from the first clock domain to a memory in a second clock domain. The first clock information may include any of a variety of types of information which link the first transferred data to the first clock domain. As one example, a set of embodiments is envisioned in which the system is a GNSS system. The GNSS system may receive RF data in real time and store the data in a FIFO buffer. Periodically, the contents of the FIFO buffer (which may be within the first clock domain) may be transferred to the memory in the second clock domain. Thus in this case, the contents of the FIFO buffer could be considered the first transferred data. The clock information could accordingly include information indicating clock information relating to when the data was received to the FIFO buffer according to the first clock domain. For example, the first clock information could include an EPOCH index number. The EPOCH index number might indicate an EPOCH number of an EPOCH occurrence during reception of the first data in the first clock domain. In some embodiments, the first clock may also include a clock cycle number (e.g., according to the first clock domain) of the EPOCH occurrence.

In some embodiments, the EPOCH index number may indicate a number of EPOCH occurrences since a baseline EPOCH occurrence. For example, the EPOCH index number may indicate a number of EPOCHs that have occurred since a page boundary was crossed. In some embodiments, an indicator may be stored linking the baseline EPOCH occurrence to an absolute system time. For example, the first clock domain may include a free-running counter (clock) indicating an absolute system time in the first clock domain. The value of this counter at the baseline EPOCH occurrence (e.g., indicating a first time according to the first time domain) may be stored as a reference linking the EPOCH index number to the absolute system time. This may be helpful to logic subsystems in the first clock domain which attempt to predict/plan for future searches of data that has been transferred to the second clock domain.

In some embodiments, the first data may also include clock information relating it to the first clock domain. For example, continuing to use a GNSS implementation for explanatory purposes, the first data may include GNSS data (or another type of data in a different implementation) as well as information indicating a clock cycle in the first domain during which an EPOCH occurred. This clock information might, for example, be recorded in the FIFO buffer along with the RF GNSS data as it is received in real time. In some embodiments, the indicator of the first time according to the first time domain may also be stored in the FIFO buffer; for example, a first location in the FIFO buffer may be reserved to store this value. Other locations may also be used to store such information.

In 804, first location information may be received. The first location information may indicate a location at which the first transferred data is stored in a memory in the second clock domain. In some embodiments, the memory may be a circular buffer (e.g., which may be managed according to embodiments of the method described with respect to FIG. 7). In this case, for example, the first location information might include an address and a page number in the circular buffer at which the data is stored. Other memory management systems and other types of location information are also envisioned.

In 806, first correspondence information may be stored. The first correspondence information may include the first clock information and the first location information for the first data. The correspondence information may be stored in an address table. Additional correspondence information (e.g., for other transferred data) may also be stored in the address table. For example, in some embodiments, the method may further include receiving second location information indicating a location at which second data is stored in the memory comprised in the second clock domain, receiving second clock information, corresponding to the second data, from the first domain, and storing second correspondence information (including the second clock information and the second location information) for the second transferred data.

In some embodiments, the control logic may be configured to store the first correspondence information (and the second correspondence information, if applicable) based on an EPOCH occurrence during reception of the first data in the first clock domain. In other words, in some embodiments (e.g., if EPOCH occurrences are less frequent than data transfers from the first clock domain to the memory in the second clock domain), the control logic may not store correspondence information for all data transferred from the first clock domain to the second clock domain. Said another way, correspondence information may only be stored for transferred data for which an EPOCH occurred while the data was received in the first clock domain. It should be noted that other embodiments, in which correspondence information is stored for all transferred data (or simply based on different criteria), are also considered.

As noted above, according to some embodiments, the control logic implementing the method may be implemented as hardware. The correspondence information (e.g., the address table) may be used by one or more logic subsystems in the first clock domain to locate and retrieve data stored in the memory comprised in the second clock domain.

As one specific example of this, it is envisioned that in some embodiments, the first clock domain may also include a processor and a local memory. The local memory may include program instructions executable by the processor for maintaining a mirrored version of the correspondence information (e.g., a mirrored version of the address table). This may, for example, facilitate the processor/memory logic subsystem in determining locations of desired search ranges on the memory in the second clock domain (e.g., in combination with the method described with respect to FIG. 7). Other manners of using the correspondence information to locate and retrieve data stored in the memory comprised in the second clock domain are, of course, also envisioned.

FIGS. 11-25—Exemplary Implementation of a GNSS Data Port Controller Block

FIGS. 11-25 and the following description thereof illustrate a specific exemplary set of embodiments of the disclosure. While these figures, and the following description with respect thereto, illustrate many of the salient features of the disclosure, it is not intended that they be considered limiting to the disclosure as a whole: numerous other implementations of the principles of the disclosure are also envisioned, and should be considered within the scope of the disclosure.

Overview

The exemplary implementation of FIGS. 11-25 relates to a data port subsystem used in a GNSS IP block for use in a mobile device. This block is essentially a multi-ported DMA controller which allows for transfer of data between data sources or sinks on the GNSS block, which may include the RF bridge (RFB) which can route data from the RFIC or internal test sources, presum engine (PRE), FFT engine (FFT) and processor (CPU) memories and a DDR memory which is external to the GNSS block. The data moved by this block are primarily of 3 types:

A) Raw data used for GPS signal processing operations like GPS or GLONASS (GLO) data sources and FFT engine;

B) Configuration information stored in constructs hereby referred to as programming structures (PS) which determine the parameters for various DSP operations by the PRE and FFT engines; and C) Data moved between CPU (X7) data memory and AXI memory.

The specifications for this block are:
1) Fetch memory configuration information for RFB, PRE and FFT processing (search ranges and page locations in DDR, FFT noncoherent memory start address, search type (GPS/GLO), FFT data source (PRE buffers/DDR)). Perform authentication on this PS to ensure data integrity and avoid errors due to software mis-programming of PS in DDR.
2) Enable both types of RF data (GPS/GLO) to be written to DDR
3) Determine whether a search range requested is valid when PRE engine gets granted or whether the data has been overwritten by new RF data (circular buffer manager/CBM). This includes both types of searches where search start address is numerically less than the search end address (Type-1 or linear search) and also the case where search start address is numerically greater than the search end address (Type-2 or wraparound search).
4) Enable PRESUM engine to read RF data from DDR as per specified search ranges when search range specified is ready
5) Allow FFT to perform write and read operations to DDR on PRE data when PRE processing is done (PRE informs FFT directly, this is not done through the DPT subsystem).
6) Allow operations (2), (3), (4) and (5) to be done concurrently while maintaining the highest level of priority for the RFB.
7) Allow the whole sequence of operations (2), (3), (4) and (5) to be smoothly terminated and restarted when a PS sequence finishes and a new processing request is received by the DPT.
8) Enable data to be transferred from the RFIC clock domain (MCLK) to the DDR clock domain (BCLK, this is external to the GNSS block). This is accomplished with the help of a FIFO with programmable threshold values which allows for data storage in case the DDR bus is not available.
9) Record the granularity of EPOCH occurrences within a 32 Mhz clock resolution which is transferred along with the RF word formed from successive RF samples (GPS/GLO) and construct a EPOCH-RF address table for use by software as assistance information to program page numbers in future searches.
10) Enable decimation of GPS and GLO data to 4 Mhz and 8 Mhz respectively for storing in DDR. Provide a bypass mode as a means to debug the overall datapath.
11) Generate the following interrupts:
    a. PS done—this generation is programmable for each PS.
    b. Authentication error
    c. PS count error
    d. RF bridge FIFO overflow error (owing to long stall on DDR)
    e. Circular Buffer Overflow
    f. DPT FSM reset complete
    g. PING or PONG thread stop request complete
    h. CPU DMA done
12) Provide a means for bus transfers in case of stalls for both reads and writes. The DPT block has an interface to IP in a CPU block which in turn convert the bus requests into AXI reads and writes on DDR.
13) Provide a Turbo mode operation for PRE (PS and data reads) and FFT (NC data reads only) processing to improve the throughput of the overall subsystem.
14) Provide a ping-pong mechanism for data processing through the DPT, PRE and FFT engines wherein a set of PS sequences (PING) can be processed in parallel with a new set of PSS being prepared and programmed into DDR by the CPU (PONG). A flag (PONG) can be set while the PING sequencing is in progress so that the DPT can start processing this new sequence as soon as the PING sequence gets done. In this way idle times between PS processing can be avoided and system throughput thereby maximized.
15) Generate the following status signals:
    a. PING/PONG flag (which mode is currently being processed)
    b. Data source/sink currently using DDR (DPT/RFB/PRE/FFT)
    c. Authentication, PS count, CB overflow, timeout and RF bridge overflow/empty error flags
    d. CBM ready and overwrite status 16) Provide a mechanism for data transfer between the CPU memories (data RAM, dcache) and the AXI memory. This is a DMA transfer in bursts (usually 16 words) with the CPU memory transfer request at the lowest priority. Bursts are also required to make sure that the RFB and other higher priority ports are not blocked out by processing large numbers of datawords between the CPU RAM and AXI DDR memory.

17) Provide a testbus for silicon visibility and debug.

Introduction

The Dataport subsystem (DPT_SS) is the interface between the GPS/GLO data sources and the off-chip DDR (dual data-rate) memory resource used for the GPS/GLO signal processing. These data sources include the following:
a) The RF bridge used to write the RFIC data source (GPS or Glonass) into DDR
b) The PreSummer used to prepare the data for FFT operations which reads and writes the data to the DDR memory
c) The FFT engine which reads and writes data from and to DDR during its FFT and IFFT passes
d) The CPU port which can be used as a DMA between the CPU's memory resources (IRAM, DRAM) and the DDR memory The DPT_SS will perform the following functions:
a) Sampling the incoming RF data from the RFIC_SS and sending it for processing by the MF-SE (realtime) and/or the DPT/PRE/FFT (playback) interface.
b) Address and control generation for DDR accesses by the various data sources described above
c) Arbitration between the data sources for accessing the DDR resource
d) Sequencing the operations during a given search and for successive searches using these data processing units.
e) Indicate when data for a search requested is available using the Circular Buffer Manager The DPT_SS is composed of the following 2 blocks: RFIC Bridge (RFB) and Data Port Controller (DPT). The DPT is then composed of the DPT State Machine, Circular Buffer Manager (CBM), and a configuration interface.

The Data Port can be programmed by the CPU, however, that programming is for Non-Search related information only. An important concept in the DPT and scalable search engine is that each of the three main blocks (DPT/PRE/FFT) reads in a PS for each search, and that each PS is related to one search only. This is done for two reasons.

1. To minimize the size of PS register flip-flops in the three blocks.

2. To clarify the boundaries of when to read in another PS, and what information should be included in a given PS.

RFIC Bridge

The function of the RFIC bridge is to capture the RF data coming from the RFIC interface to the GNSS block and direct it for processing to the MF/SE (realtime) logic and/or to the DPT/PRE/FFT (playback) logic. A block diagram showing the 2 paths from the RF data source is shown in FIG. 11.

The data capture begins after the block reset is deasserted when the EPOCH signal goes high from the TME block. The rfb_config_if issues a start_iq_capture signal to the RFB_IQ_CAPTURE block which can optionally sample the data at rising or falling edge of MCLK64 (this is the clock reference for the incoming rfic_ss data). This data is then muxed with a test pattern generator inside this block after which it is sent to the realtime path (rfb_glo_ch_mixrs) and the playback path (rfb_preproc). A series of signals (start_iq_capture, start_preproc, start_muxes, start_fifo) act as controls for the datapath in the respective sections and are referenced from the time the data transfer is started from the rfb_config_if.

Figure 11:
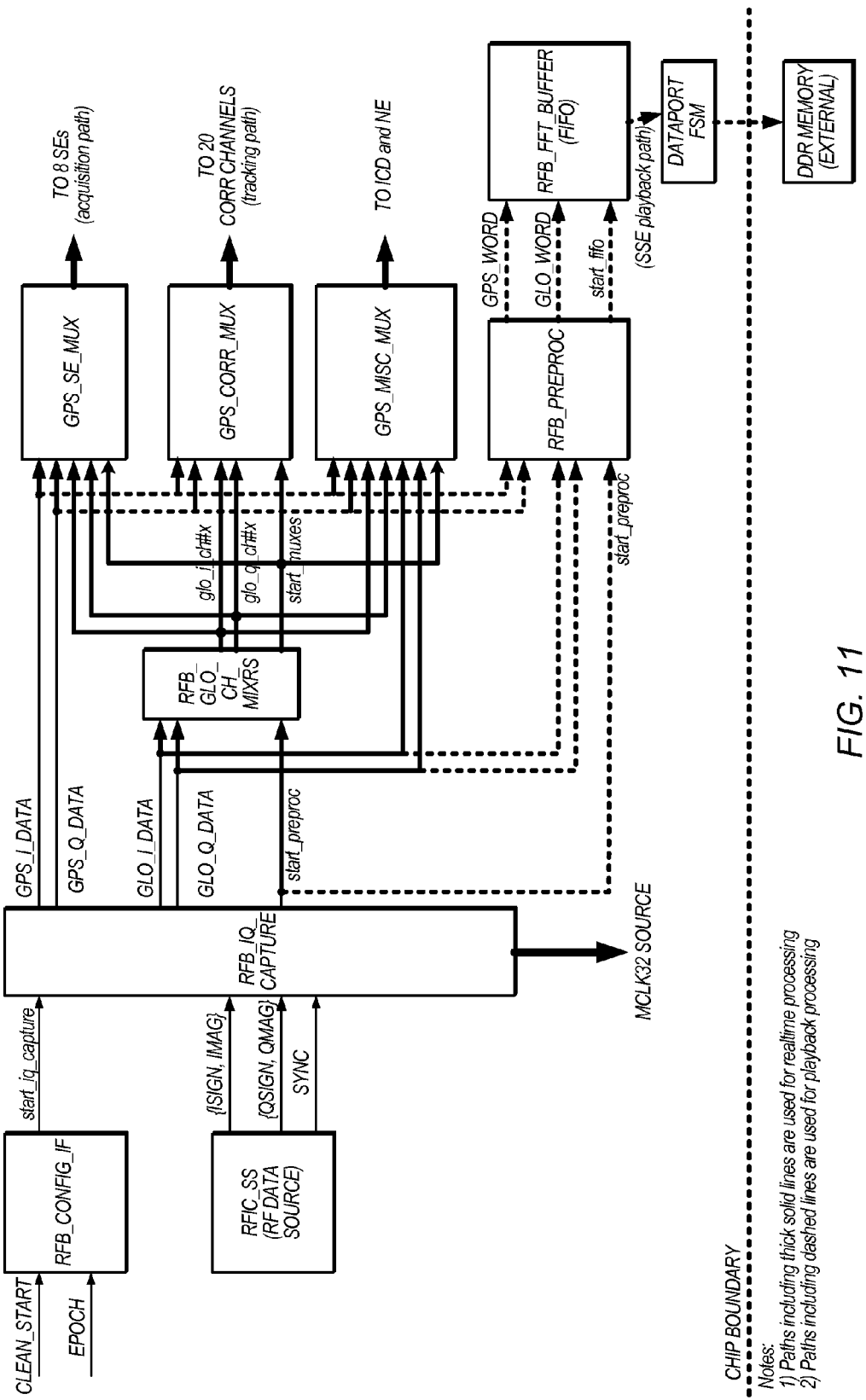

The data paths in the realtime processing case are shown in solid bold lines in FIG. 11. In this case the data for GPS comes through a single IQ channel and is routed to the following blocks:
Search engines (Total of 8)
Correlators (Total of 20)
ICD
Noise estimators (Total of 2)

The data for GLO is mixed with 14 programmable phase offsets in the block shown as RFB_GLO_CH MIXRS and is also routed to the above blocks.

Software (S/W) can program which of the single GPS or 14 GLO channel data is routed to each of the SE, CORR, ICD and NE. In case of the ICD the selection is allowed only between the GPS, raw/unmixed GLO and the mixed GLO data on channel #0 (x=0 in glo_ch_mixr output).

The data paths in the playback processing case are shown in dashed bold lines in FIG. 11. This path is used to capture the data from the RFIC_SS (2 bits of I, 2 bits of Q) into a FIFO in the RFIC clock (MCLK) domain which is then transferred to the DDR (32-bit) in the AP clock (BCLK) domain by the data port finite state machine (FSM). The data for GPS and GLO are both (optionally) decimated in the RFB_PREPROC block. There is a S/W control bit which controls whether decimated or original data (bypass) is routed to the RFB_FFT_BUFFER which contains the FIFO used for data transfer between the 2 clock domains. Apart from the GPS and GLO data (decimated or bypass) the FIFO also contains a record of which MCLK32 cycle the EPOCH occurred in. The data word thus has 38 bits of which 32 bits are the GPS/GLO bits and are stored in the DDR. The remaining 6 bits indicate the position of the EPOCH within the last 32 (16) clock cycles for GPS (GLO) data after which the data was written into the FIFO. More details on EPOCH recording are available in the section on "Circular Buffer Manager". The expected operating mode is GPS decimation and GLO bypass.

Figure 12:
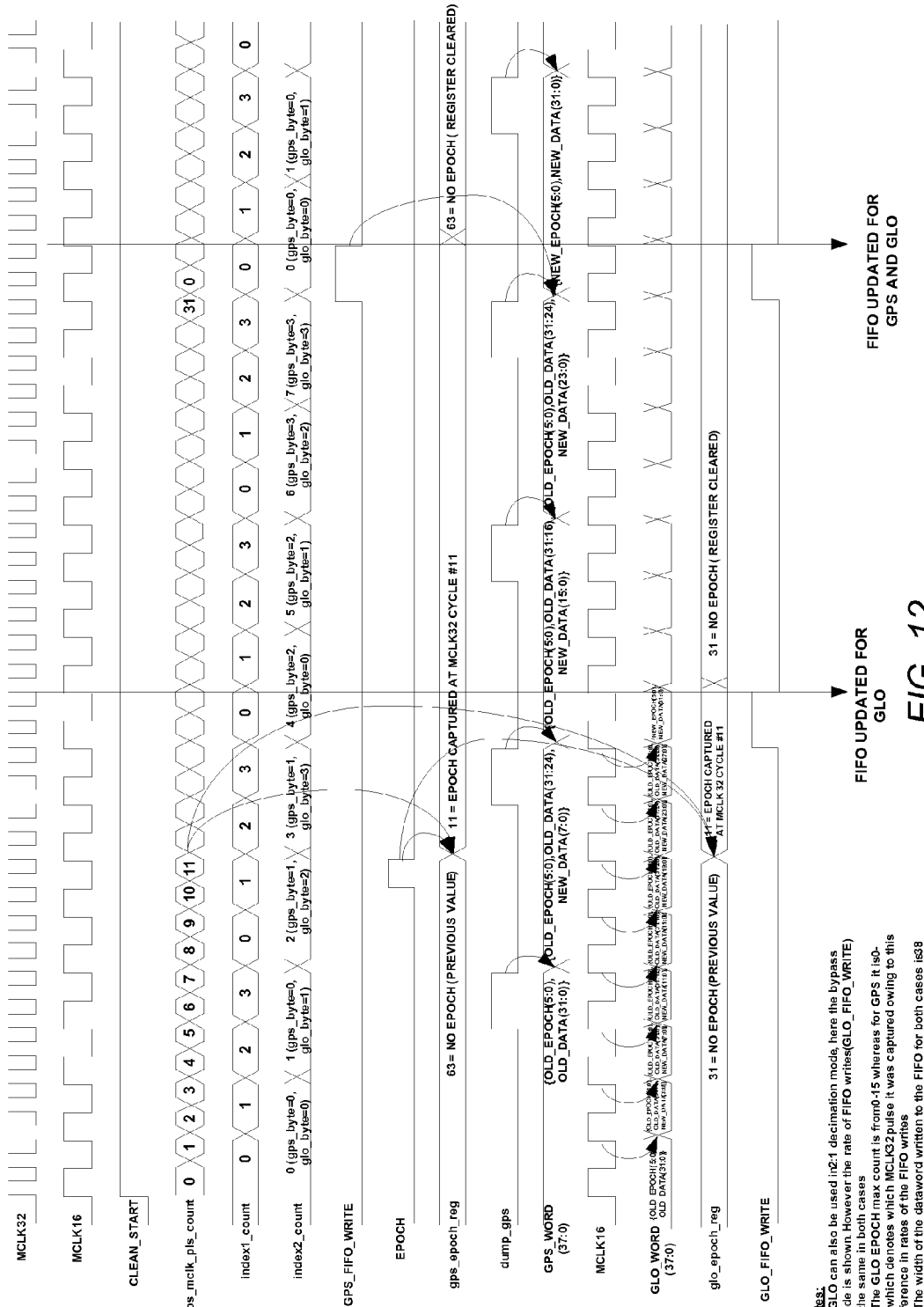

FIG. 12 is a timing diagram showing the data capture from the GPS/GLO IQ streams into the FIFO along with the EPOCH recording. FIG. 13 illustrates the RFB data alignment (byte ordering) in FIFO/DDR.

Data Port Controller

The Data Port Controller consists of the following blocks:
a) Data Port State Machine
b) Data Port Configuration Interface
c) PIFAXI Interface The Data Port Configuration Interface controls the registers in this block which are programmable by the CPU. The PIFAXI Interface is an IP block which allows interfacing the data port block to the AXI Interface.

Figure 14:
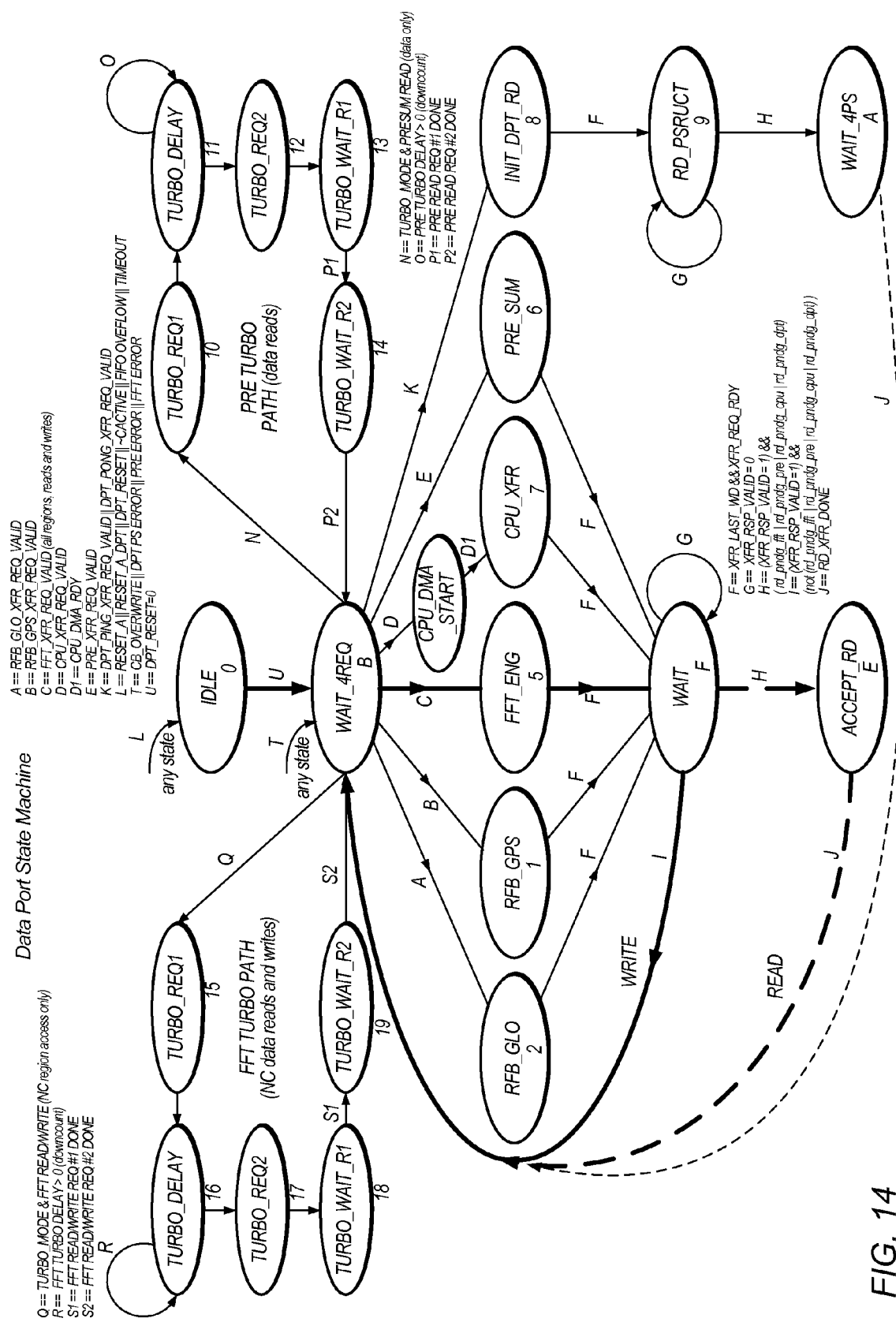

The Data Port State Machine (DPT FSM) is designed to sequence the data transfer for the DSP operations required in a search between the above DPT sources and the DDR memory. FIG. 14 is a state diagram illustrating the Data Port State Machine.

The DPT state machine interfaces with the DDR slave through the PIFAXI block. Both read and write transfers can be generated by the FSM, however the direction of the transfer depends on the source and some sources are restricted to either reads or writes only based on the system requirements.

A brief description of the FSM operation follows.

The DPT state machine resets to IDLE state under the following conditions:
a) A chip reset
b) A block reset (DPT subsystem level)

c) A local reset (single bit from DPT control registers, default power-on-reset (POR) state of this control bit will hold the DPT FSM in the IDLE state)
d) Reset signal from AP external to the GNSS block (CSYSREQ deasserted)
e) FIFO overflow error The default initial functional (non-reset) state of the FSM is WAIT_4REQ. This can be entered in the beginning when the processor releases the DPT FSM from reset (given all pending error conditions which hold the FSM in IDLE are cleared e.g. FIFO overflow and CSYSREQ driven reset).

Once the DPT FSM is in the WAIT_4REQ state DDR transfer requests from any source (RFB GPS, RFB GLO, CPU, PRE, FFT or DPT itself) can be serviced. The RFB requests have the highest priority since the real-time RF data source cannot be stalled and any data losses would cause a corruption for the corresponding search operations to be done with the PRE and FFT engines. At the start of a PS processing the DPT always fetches its own PS before PRE and FFT issue any PS or data transfer requests through the DPT FSM. The DPT itself is capable only of executing read operations and this is done at the start of a new PS fetch (INIT_DPT_RD) once XFR_REQ_RDY is asserted high from the PIFAXI interface to the DDR. The first 2 states (RD_PSTRUCT and WAIT_4PS) are used by the DPT itself to directly read its own programming structures (PS) from the DDR. This information is stored in its local DMA registers (readable by the processor) and this is outlined in Table 1:

TABLE 1

| | | DPT PS Breakdown | | |
|---|---|---|---|---|
| DMA REGISTER # | NAME | BITS | DESCRIPTION | COMMENTS |
| 0 | SEARCH BASE | 14:0 | This is the upper 15 bits of the starting address for the presum to begin its search of the GPS or GLO data. The lower 6 bits are 0. | 64 B resolution used internally on full address generated by DPT to DDR. |
| 0 | SEARCH LIMIT | 30:16 | This is the upper 15 bits of the ending address for the presum search of the GPS or GLO data. This may wraparound the GPS or GLO search base address. The lower 6 bits are 0. | 64 B resolution used internally on full address generated by DPT to DDR. |
| 1 | ABSOLUTE_PAGE_NUMBER | 7:0 | This is used by the circular buffer manager to distinguish between a search range which has yet to be completely filled with data by the RF bridge versus a range that has data overwritten. Because of the circular nature of the buffer the SEARCH_BASE and SEARCH_LIMIT parameters are by themselves not enough to determine whether data for a search requested is still valid in the circular buffer. | |
| 1 | PAGE_SECTION | 15 | This is achieved by the data port PS containing this field which allows the circular buffer manager to determine the validity of the RF data for both GPS and GLO. Toggle bit which changes every time hardware RFB page write pointer crosses the FF boundary. Starting value after reset is 0. | |

TABLE 1-continued

DPT PS Breakdown

| DMA REGISTER # | NAME | BITS | DESCRIPTION | COMMENTS |
|---|---|---|---|---|
| 1 | FFT_INIT_DATA_ADR | 26:16 | Non-coherent region to be used for FFT and IFFT processing (4 KB aligned for GPS, 2 KB aligned for GLO) | |
| 2 | AUTHENTICATION | 31:24 | Should be set to 8'h99, else AUTH_ERROR is generated | |
| | | 23:16 | Index for programming structure (PS) count, must match internally generated count else PS_COUNT_ERROR is generated | |
| | | 15:8 | Last PS indicator: should be set to 8'hFF for last PS, can be arbitrary value for all other PS in a given PS sequence (PSS). | |
| 2 | CONTROL | 0 | Search mode (0 = search enabled for GPS data, 1 = search enabled for GLO data) | |
| | | 1 | FFT data source (0 = PRE has FFT playback data, 1 = DDR has FFT playback data) | |
| | | 2 | Interrupt mask (0 = disable irq generation when ongoing PS is completed, 1 = enable irq generation when ongoing PS is completed) | |
| 3 | FFT_PEAK_BASE_ADR | 11:0 | Peak table address region for FFT (512 B aligned) | |
| 3 | FFT_SOFTCODE_BASE_ADR | 22:12 | Softcode address region for FFT (1 KB aligned) | |
| 4 | CH0_CARR_IPHASE | 31:0 | For Presum use | |
| 5 | CH1_CARR_IPHASE | 31:0 | For Presum use | |
| 6 | CH2_CARR_IPHASE | 31:0 | For Presum use | |
| 7 | CH3_CARR_IPHASE | 31:0 | For Presum use | |
| 8 | CH4_CARR_IPHASE | 31:0 | For Presum use | |
| 9 | CH5_CARR_IPHASE | 31:0 | For Presum use | |
| A | CH6_CARR_IPHASE | 31:0 | For Presum use | |
| B | CH7_CARR_IPHASE | 31:0 | For Presum use | |
| C | CH8_CARR_IPHASE | 31:0 | For Presum use | |
| D | CH9_CARR_IPHASE | 31:0 | For Presum use | |
| E | CHA_CARR_IPHASE | 31:0 | For Presum use | |
| F | CHB_CARR_IPHASE | 31:0 | For Presum use | |

More details about the use of the programming structure are given in the section on the Circular Buffer Manager (CBM).

After the DPT has fetched its own PS this can be followed by the PRE and FFT fetching their respective PS (read operations through the DDR interface). These PS fetch operations by these 2 blocks can occur in any order, however, the RFB GPS and GLO requests should have priority because the RF interface always operates in real-time. The priority is currently set as below (hard-coded, not programmable):

RFB_GPS>RFB_GLO>FFT>PRE>CPU>DPT(PS only)

The CPU has lowest priority since DMA transfers between CPU memories and DDR through the dataport are not expected to happen frequently and can wait until other critical data transfers which are related to the search have finished.

All read and write transfers through the DPT FSM are burst transfers with fixed length. The size of the transfer is determined by the interface requesting the transfer and is programmable by the CPU. The FSM interfaces to the PIFAXI interface and handshake signals between the 2 sides are used to control the duration of a single transfer within the burst (XFR_REQ_RDY, XFR_RSP_VALID) and also the proper termination of a burst (XFR_RSP_CONTROL). The PIFAXI interfaces with the AXI interface outside the GNSS block and the stall signals from the AXI are reflected back to the FSM using these XFR* signals on the PIFAXI interface.

The transfer types for the different data sources are given in Table 2:

TABLE 2

Types of Data Transfer Through DPT

| Source | Transfer type | Data type |
|---|---|---|
| RFB_GPS | Write | Data |
| RFB_GLO | Write | Data |
| FFT | Read/write | PS and data |
| PRE | Read | PS and data |
| CPU | Read/Write | Data |
| DPT | Read | PS |

The DPT FSM controls the address generation during the PS reads and data read/writes by the DPT, PRE and FFT. The base addresses for the DPT, PRE and FFT PS reads are stored in programmable (e.g., by the CPU) registers. Only the upper 15 bits of the entire 2 MB addressable range (21 address bits in total) are accessible through the registers (i.e. the programmable PS addresses have a 64 byte resolution for DPT and FFT, 128 byte resolution for PRE). As an individual PS is fetched an internal counter updates the PS number and the address for the next PS. As part of the authentication for every DPT PS (refer to Table 1) the PS count is required to be part of every PS that is programmed to DDR. The logic inside the DPT FSM compares this versus the expected PS count from hardware. Additionally it also checks for the PS authentication field (required to be 8'h99 for DPT). If these 2 match what the hardware expects the PS is deemed valid and the rest of the processing through the PRE and the FFT is allowed to proceed after the lower bits of the address register are updated for the next PS. If there is a mismatch this is treated as a PS processing failure and the FSM is halted by reverting to the WAIT_4REQ state. More details on error handling are given in the section on "Error Handling".

The PRE and FFT have their own PS authentication checks inside the respective FSMs. If these are successful then PRE and FFT data processing can proceed through the DPT FSM. Note that the same states are used for PS read and data read by the PRE (PRE_SUM) and similarly for PS and data read/writes by the FFT (FFT_ENG). The DPT FSM distinguishes between address generation for these 2 cases (PS versus data) for these blocks by using a XFR_ID signal issued by the PRE or FFT. For PS addressing a similar scheme to the DPT described above is followed (upper 15 bits of the 2 MB address space are CPU configurable, lower 6 bits are controlled by the DPT FSM). Data addressing is done as follows:

a) For transfers involving the CPU the start address of the transfers on the AXI and CPU data memories are initialized in CPU registers. The DPT FSM loads the programmed AXI address for the first transfer, after which an auto-increment is applied based on the programmed transfer size for subsequent transfers till the required number of words are transferred. Updates of the CPU memory side addresses are handled by the CPU-DMA sub-block of DPT.

b) For transfers involving PRE the starting address is always the SEARCH_BASE which is part of the DPT PS (refer to Table 1). As soon as the area requested for a given search (SEARCH_BASE through SEARCH_LIMIT) becomes available for a search as indicated by the Circular Buffer Manager (described in a subsequent section) the PRE is directed by the DPT FSM to start reading the RF data starting at the SEARCH_BASE. The burst size is programmed by CPU registers which thereby control the size of the address increments. Note that the minimum resolution for address increments by the PRE engine is 64 bytes.

c) For transfers involving FFT the base address for all reads and writes is obtained from the DPT PS field FFT_INIT_DATA_ADR (refer to Table 1). This field has a 1 KB resolution (i.e. only upper 11 bits of the available 21 bits in DDR are required to be programmed in this field of the DPT PS). 3 types of FFT addresses are generated using the PS_INIT_DATA_ADR, PS_PEAK_TABLE_ADR and PS_SOFTCODE_ADR from the DPT PS (Table 1) as reference:

a) FFT data address: These are the first 16 (maximum) 4 KB partitions containing data from the FFT and IFFT processing of the PRE data.

b) FFT peak table address: This is the 512B aligned partition containing the peak search result on the above FFT/IFFT processed data. The upper 12 bits of the starting address are derived from the PS peak table address, the rest of the lower bits are initialized to 0 and updated by hardware.

c) FFT softcode address: This is the 1 KB aligned section which contains the FFT of the PRN softcode used for a particular search. The upper 11 bits of the starting address are derived from the PS softcode address, the rest of the lower bits are initialized to 0 and updated by hardware.

Within each of the 3 categories shown above, the lower bits of the addresses (not coming from the PS) increment according to the burst size used in the transfer, which is available in CPU programmable registers.

Figure 15:
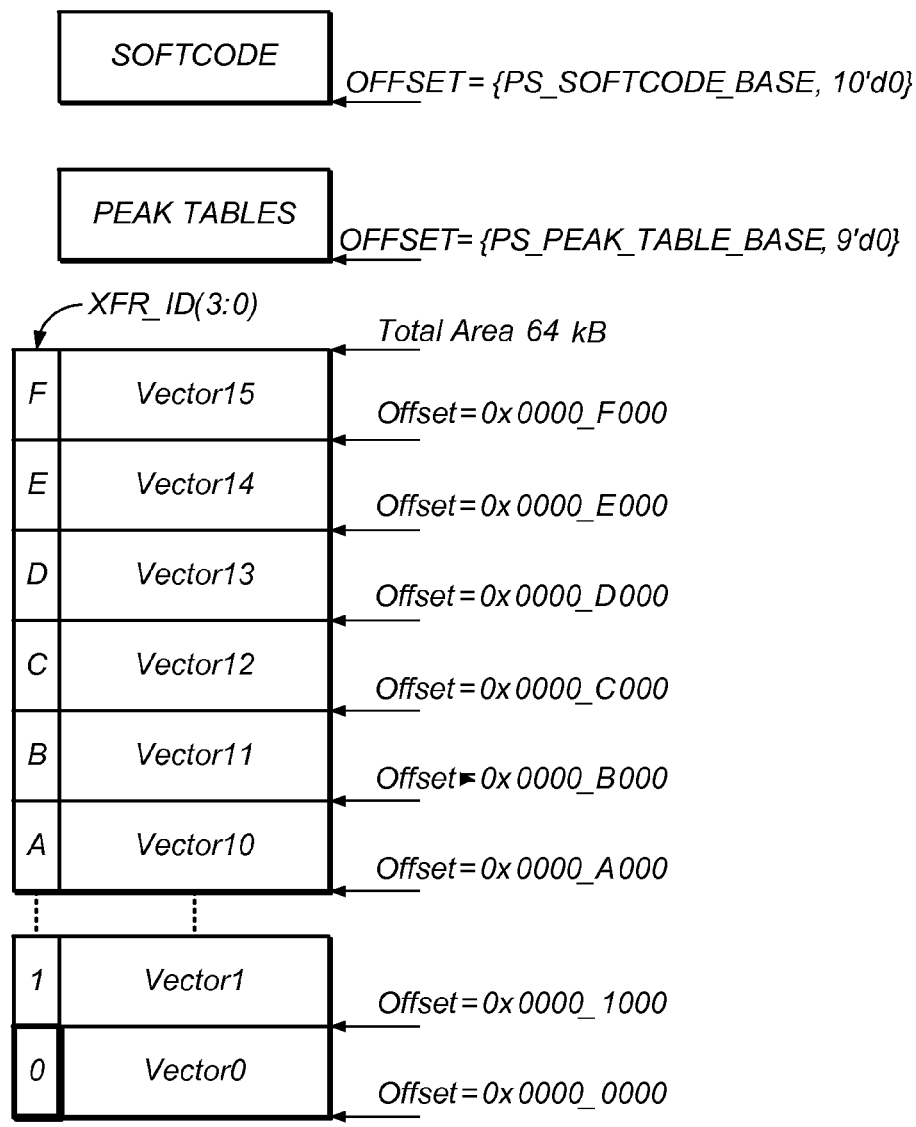

FIG. 15 shows the data partitions for the FFT engine in DDR memory. The "peak tables" are the final result of the FFT processing for a given PS (search) and there could be 16 peak search tables corresponding to FFT/IFFT processing of the data from the 16 PRE channels. These are stored starting at the address:

{GNSS_BASE[10:0],{PS_FFT_PEAK_BASE_ADR},0x000} where:
DDR Address[31:21]=GNSS_BASE[10:0]
DDR Address [20:9]=PS_FFT_PEAK_BASE_ADR[11:0]
DDR Address[8:0]=0x000

The address increment for obtaining peak values on the IFFT processing for data on the next PRE channel (total of 16) is controllable by CPU programmable registers.

Note that the upper 11 bits of the address denoted by GNSS_BASE[10:0] denote where the 2 Mb space allocated for DPT related transactions occur in the overall 32-bit addressable AXI (DDR) memory. Because of CPU related memory mapping requirements the overall DDR space available is restricted from 0x10000000 to 0x20000000, which implies that these 11 bits can have a value ranging from 11'h080 to 11'h100. These are programmed in the top-level ASIC configuration registers.

For flexibility and speed of processing PS sequences a ping-pong scheme is envisaged where successive chains of PS processing can occur with minimum latency, thereby ensuring a high throughput for the overall processing during a search through the PRE and FFT engines. This works as follows:

During the first time when the DPT FSM is used after exiting the IDLE state a new PS fetch starts with the CPU issuing a PING or PONG request (DPT_PING_XFR_REQ_VALID=1 or DPT_PONG_XFR_REQ_VALID=1, refer to FIG. 14). Depending on the request the DPT FSM fetches the PS for DPT/PRE/FFT from the PING or PONG registers. Both of these are CPU programmable. After the end of one set of processing, e.g., for PING, the FSM starts a new PS sequence (PSS) processing if there is a latched PONG request. This will be the case if the CPU has prepared a new set of PS in DDR (a different memory region as indicated by the PONG address for PS) while the PING processing was in progress. Enabling such a flow reduces the latency between successive sets of PSS processing. If there was no latched PONG request then the CPU can start a new PS processing either by using the PING or PONG PS registers, DPT_PING_XFR_REQ_VALID=1 or DPT_PONG_XFR_REQ_VALID=1. PSS sequences can then be as below:

- Series of PING requests
- Series of PONG requests
- Alternating PING-PONG requests (this flow minimizes latency between PSS processing)

Note that at the very start for a given PING PSS an internal counter updates the PS addresses for all 3 engines (DPT/PRE/FFT), starting with the base PS address that was programmed by S/W; this continues for successive PSS. S/W has to re-program the PING PS base address at the start of a PSS if such is desired. Similar considerations apply for PONG PSS processing.

Turbo Mode

In order to accelerate processing through the PRE and FFT, a turbo mode processing scheme has been implemented for certain types of data accesses from the respective engines. This works in cases where read requests are issued in pairs, which is the case for PRE data reads and FFT reads and writes of its non-coherent memory. In this case the FSM will issue 2 successive bus requests separated by a programmable interval called TURBO DELAY and then wait for the 2 requests to complete. States 10 through 19 in FIG. 14 show these turbo mode states. This takes advantage of the fact that there is a QOS timer on the AXI which services every pending request after a fixed time interval—so essentially this delay or gap in servicing the second request can occur in parallel with the first request being completed. The overall time for the 2 requests to complete is thus reduced in the general case, which helps to improve overall throughput of the system. For writes, Turbo mode access throughput improvments are done by locking the 2 transfers back-to-back instead of letting other data sources intervene between transfers, as is done with non-Turbo/regular mode transfers.

Error Handling

The DPT FSM handles errors which may arise from the DPT subsystem itself, PRE and FFT engines. These are the types of errors which may occur in the various subsystems and which are handled in the DPT FSM:

a) DPT:
  a. Fatal errors: RFB FIFO overflow, CSYSREQ driven AXI release
  b. Critical errors: PS authentication, PS count, Circular buffer overflow
b) PRE: PS count, PS authentication, FSM error
c) FFT: PS count, PS authentication The DPT FSM will treat the fatal errors as unrecoverable and will put itself in reset thereby reverting to the IDLE state after completing all outstanding AXI transactions. The DPT can resume normal operation only when the DPT_RESET bit is deasserted by the CPU. For all the other error types (Critical DPT, PRE and FFT) the DPT FSM will discontinue all further PS processing (ongoing PING/PONG request and any latched PING/PONG request) and will revert to the WAIT_4REQ state. In this case RFB GPS, RFB GLO and CPU DMA transfers will be serviced and the DDR circular buffer will continue to be filled, however a new PS processing can only resume after the CPU sets the DPT_PING_XFR_REQ_VALID or DPT_PONG_XFR_REQ_VALID bit high. For the critical DPT errors and PRE and FFT errors, the PS number where this event occurred is recorded along with the PSS (PING/PONG) and the error type.

The error handling between the 3 blocks in hardware is done in a manner such that the DPT always broadcasts an error signal to the other 2 blocks irrespective of where the error occurred. If an error occurs in DPT it will signal the PRE and FFT and put its own FSM in the appropriate state (IDLE/WAIT_4REQ). If an error occurs in PRE it first informs DPT which issues a common error signal for both PRE and FFT. Similar considerations apply when an error occurs in FFT. Note that generation of the interrupt signals on error conditions are done by the respective blocks where the error originated.

DPT FSM Stationary Conditions and Exit Criteria

Table 3 summarizes the cases where the DPT FSM has reached the IDLE/WAIT_4REQ condition after the completion of a PS/PSS or when an error has occurred and the necessary conditions to start a new PS or PS sequence processing:

| CONDITION | DESCRIPTION | STATIONARY STATE | EXIT CRITERIA |
|---|---|---|---|
| PSS_COMPLETE | Finished processing last PS in given chain of programming structures (PING or PONG) | WAIT_4REQ | 1. DPT_PING_XFR_REQ_VALID = '1' (may be latched or issued by CPU (DPT_CTL[24]) 2. DPT_PONG_XFR_REQ_VALID = '1' (may be latched or issued by CPU) (DPT_CTL[25]) |
| PS_DONE | Finished processing current PS in PS sequence (does not refer to the last PS) | WAIT_4REQ | Automatic transition to DPT_INIT_RD once outstanding RFB transfers are done. This starts new PS processing in the current PS sequence. |
| PS_CNT_ERR | An error has been detected in the PS count field of the current DPT PS | WAIT_4REQ | 1. DPT_PING_XFR_REQ_VALID = '1' after error has been cleared by CPU 2. DPT_PONG_XFR_REQ_VALID = '1' after error has been cleared by CPU |

| CONDITION | DESCRIPTION | STATIONARY STATE | EXIT CRITERIA |
|---|---|---|---|
| AUTH_ERR | An authentication error has been detected in the current DPT PS | WAIT_4REQ | 1. DPT_PING_XFR_REQ_VALID = '1' after error has been cleared by CPU<br>2. DPT_PONG_XFR_REQ_VALID = '1' after error has been cleared by CPU |
| CB OVERWRITE | Circular buffer overwrite detected by CB manager during PRE read | WAIT_4REQ | 1. DPT_PING_XFR_REQ_VALID = '1' after error has been cleared by CPU<br>2. DPT_PONG_XFR_REQ_VALID = '1' after error has been cleared by CPU |
| PRE ERROR | Error condition in PRE engine | WAIT_4REQ | 1. DPT_PING_XFR_REQ_VALID = '1' after error has been cleared by CPU<br>2. DPT_PONG_XFR_REQ_VALID = '1' after error has been cleared by CPU |
| FFT ERROR | Error condition in FFT engine | WAIT_4REQ | 1. DPT_PINGXFR_REQ_VALID = '1' after error has been cleared by CPU<br>2. DPT_PONG_XFR_REQ_VALID = '1' after error has been cleared by CPU |
| RFB OVERFLOW | Overflow in FIFO which transfers data from RFIC_SS to DDR through DPT (owing to long stall on AXI) | IDLE | Set DPT_RESET = '0' followed by DPT_PING_XFR_REQ_VALID = '1' or DPT_PONG_XFR_REQ_VALID = '1' May also need to re-enable RFB port controls (DPT_CTL[21:20]) |
| CSYSREQ | Deassertion of signal from external source which is a request to release the AXI bus | IDLE | Set DPT_RESET = '0' followed by DPT_PING_XFR_REQ_VALID = '1' or DPT_PONG_XFR_REQ_VALID = '1' May also need to re-enable RFB port controls (DPT_CTL[21:20]) |

AXI Flushing During Reset/Exception Handling

Figure 16:
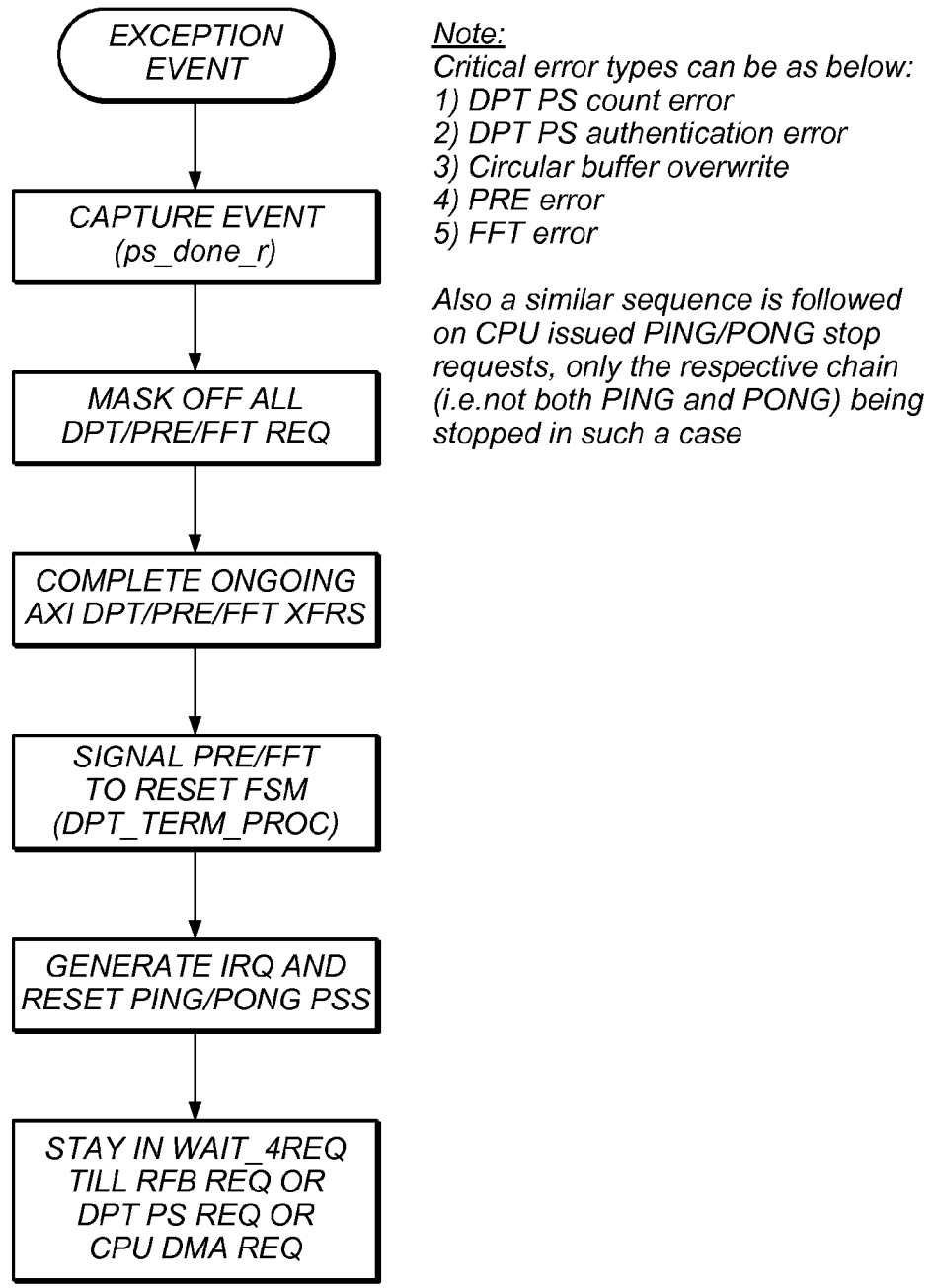
Figure 17:
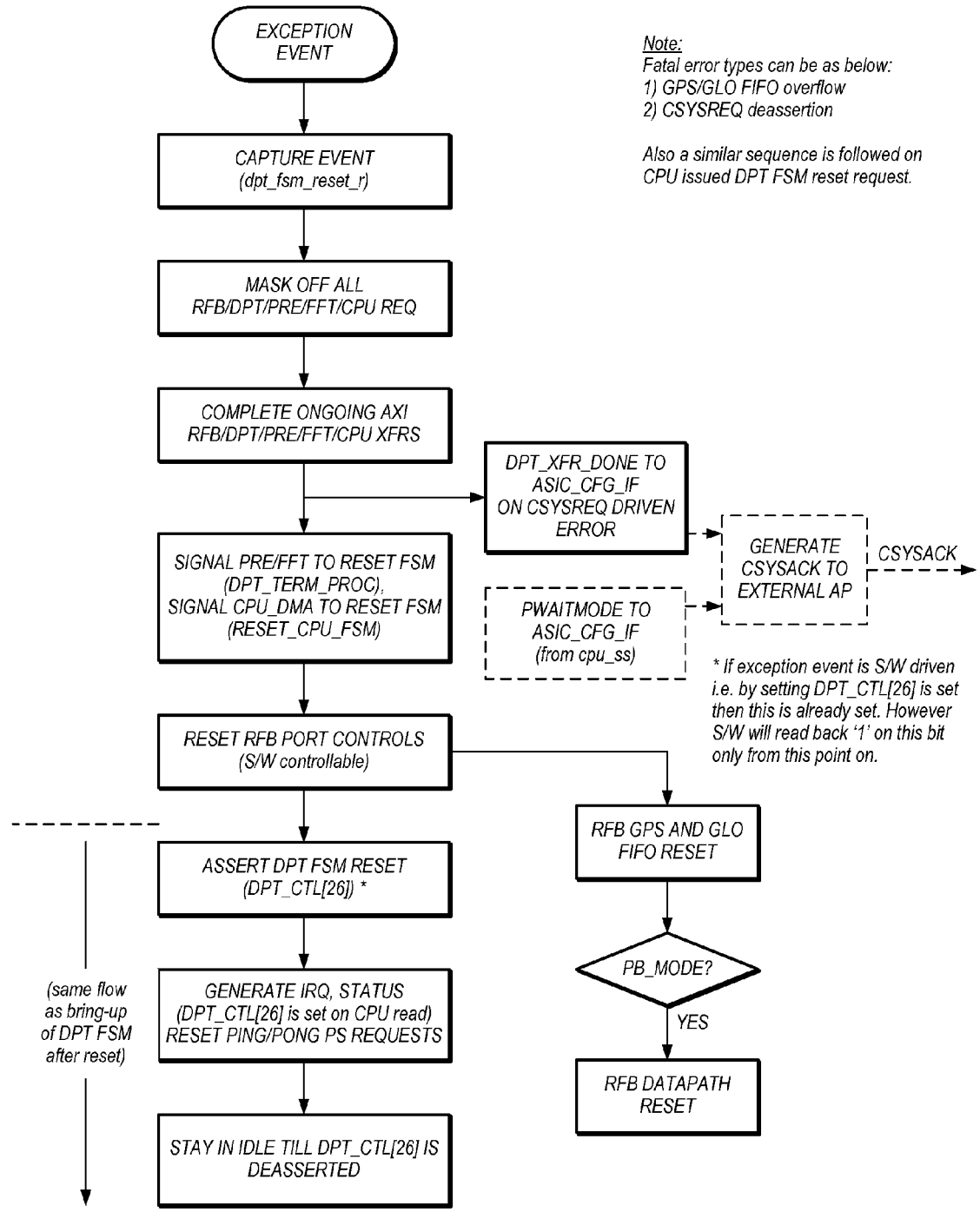
Figure 18:
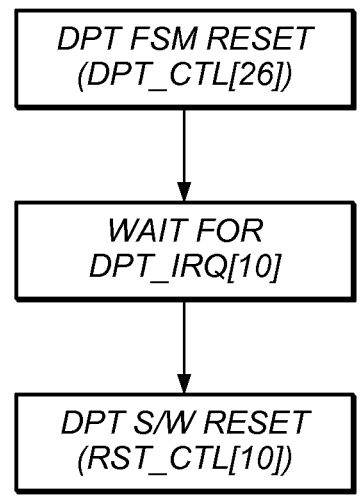

When an exception or error occurs in the DPT it needs to be handled in such a way that all outstanding AXI transactions are completed and then the FSM can put into a quiescent state (e.g., WAIT_4REQ/IDLE, as in the previous table). FIGS. 16-18 are flowcharts showing how this is handled for the exception categories mentioned earlier (fatal errors and critical errors). FIG. 16 illustrates how critical errors are handled in the DPT FSM. FIG. 17 illustrates how fatal errors are handled in the DPT FSM. FIG. 18 illustrates the expected software sequence for DPT block reset.

RFB Path Reset Control

Some hooks are provided through software where the RFB port control bits (DPT_CTL[21:20]) will allow the whole RFB datapath to be released or put in reset. This behavior is not the default at power-up so that the legacy mode (MF-SE) operation is not directly coupled to the playback path. A bit called PB_MODE needs to be set to enable this behavior where a single write to the RFB GPS/GLO port control will release the RFB datapath from reset and also enable the flow of RF data from the RF clock (MCLK) to the DDR memory through the DPT FSM. If either GPS or GLO RFB port controls are enabled the RFB datapath will capture RF samples (starting with EPOCH as in the MF-SE case). The RFB FIFO will be held in reset if the corresponding RFB port control is not enabled. In this way FIFO overflow issues will be avoided since the enables on the RFB and DPT (FSM) sides are now common.

Figure 19:
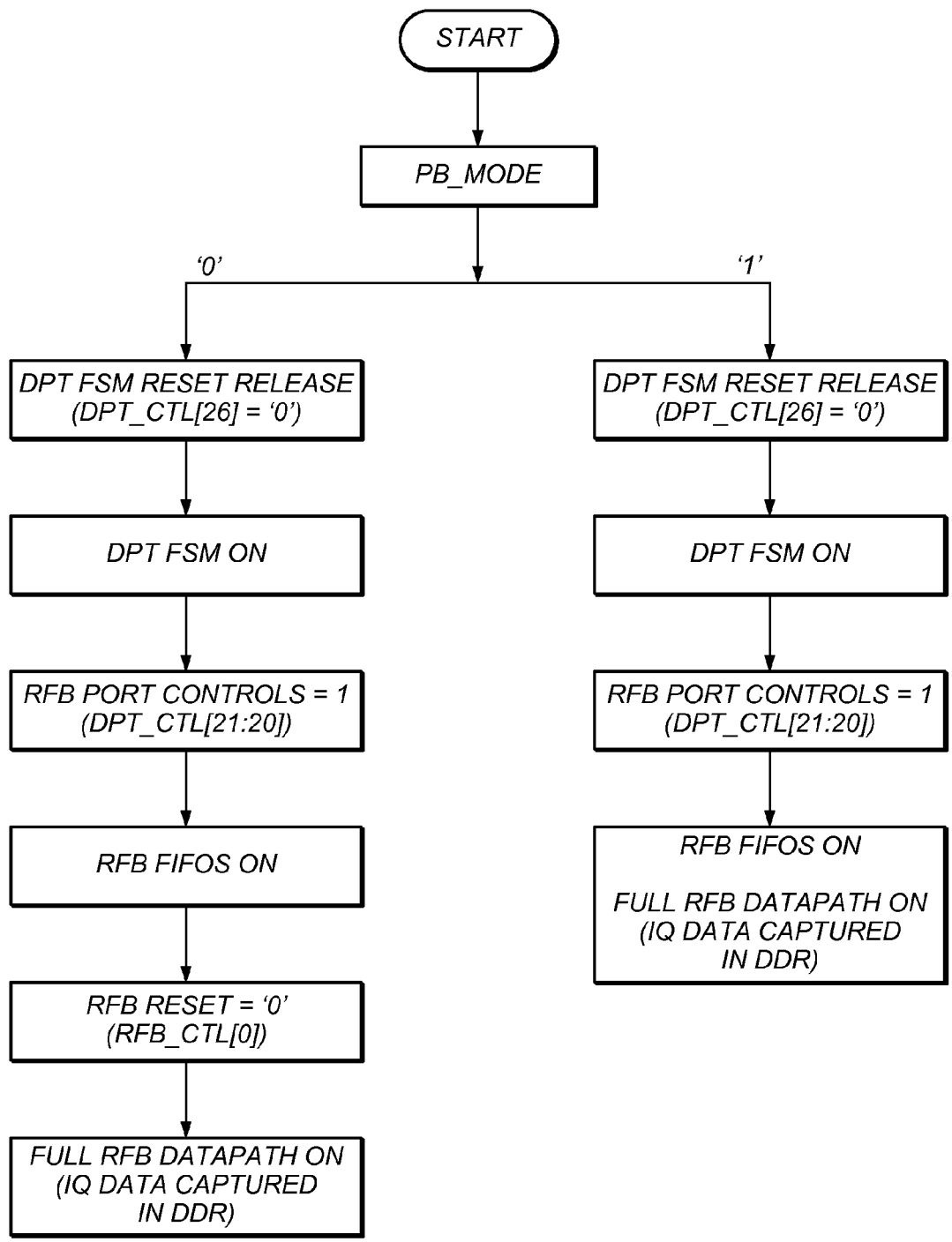

The two datapath reset release schemes, with their effect on hardware operation, are shown in FIG. 19.

DDR Memory Usage Example

Figure 20:
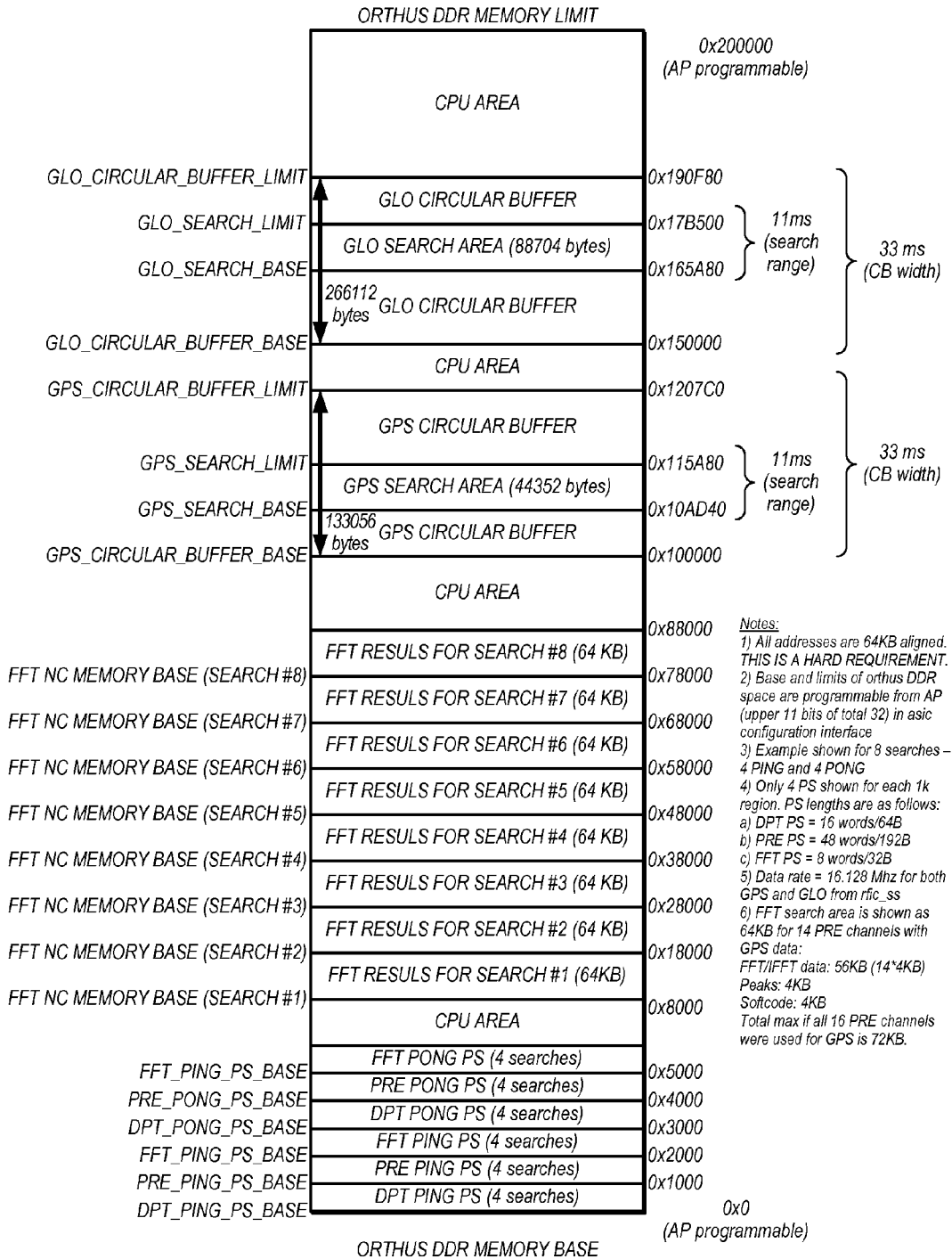

FIG. 20 shows an example usage of the DDR memory for DPT/PRE/FFT PS and data (PRE read of a successful GPS/GLO search and FFT processing).

Circular Buffer Manager (CBM)

The GNSS block may be allocated 2 MB of DDR memory. This memory is expected to be used for the following purposes by the DPT, PRE and FFT blocks:

a) 2 separate circular buffer (CB) regions for GPS and GLO which will allow the RF Bridge to continuously write the RF data once the DPT is taken out of the IDLE state. The CB base and limits are set by the CPU in the DPT peripheral registers for both GPS and GLO.

b) A non-coherent memory region used by the FFT region to write, read and writeback the data from its FFT and IFFT processing and also use it to store the peak search and softcode FFT results.

c) The programming structures (PS) used by the three engines (separate regions for PING and PONG processing). Each PS will need its own PS, for each search. Each engine will read in the PS when enabled into operation by the CPU, or if the existing PS is complete (marked by the FFT processing the final vector from the PRE). For example, the DPT will read in its PS when the CPU writes to a DPT control bit (DPT_PING_XFR_REQ_VALID='1' or DPT_PONG_XFR_REQ_VALID='1'). The PS will be read by the PRE engine to prepare the data for the FFT using the Doppler and other parameters extracted from its own PS, when the CPU enables it. Similarly the FFT engine will perform its FFT and IFFT processing on the PRE processed data in accordance with the parameters programmed in its PS.

The circular buffer (CB) manager has the following functions:
a) Controlling the address generation through the DPT subsystem for the RFB GPS and RFB GLO sources. This is done for the RF bridge data writes into DDR and supports address wrap-around in the CB region.
b) Keeping track of when RF data for a requested search is available. This includes both deciding when the search data first becomes available, and when it is no longer available, and must be considered a "Stale" search.
c) Maintaining the last 4 values of DDR addresses where an EPOCH occurred which enables S/W to establish a reference for programming parameters in DPT PS for upcoming searches (search limits, page numbers).

Figure 21:
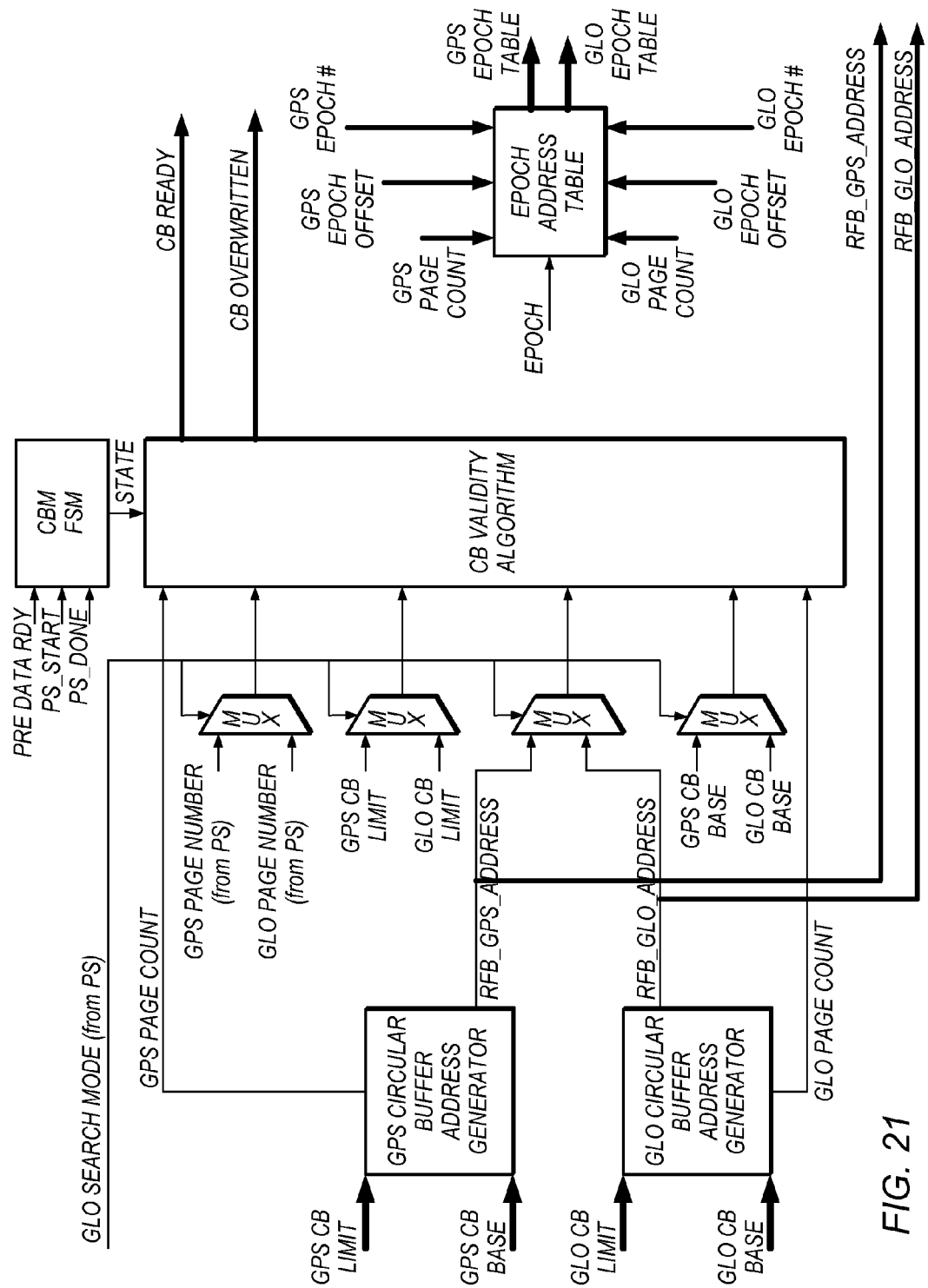

For (a) the base and limits for the circular buffer where the RFB GPS and GLO data are available in CPU programmable registers. In case of (b) the ranges for a given search are available in the DPT PS. FIG. 21 is a block diagram of the CBM.

The CBM dynamically tracks the address pointers it generates for the RF bridge to determine whether a search range, as requested, is available in memory. This is illustrated in FIG. 22.

As shown, there are 2 types of searches possible because of the circular nature of the memory region allocated for RF data; type-1 or linear searches and type-2 or wraparound searches.

In a type-1 search, the search base address is less than the search-end address. Here two types of situations can arise with the location of the write pointer with respect to the search addresses.

In the first case, the write pointer can be ahead (or greater than) both the search base and end addresses. In this case data is ready for the search and this is indicated to the PRE engine by the DPT. The PRE then requests this data be transferred (read) from the DDR.

In the second case, where the write pointer is between the search addresses, the search is invalid. In this case the data is either not yet available for the search (search end address not yet reached by RF bridge) or the data was overwritten by the RF bridge. (e.g., the case where the address pointer has rolled over, and overwritten some of the requested search area data starting from the search base).

In a type-2 search, the search base address is greater than the search end address. In a similar manner to the linear (type-1) case, two types of situations can also arise here, as shown in FIG. 22. In the first case, the search is valid; the write pointer is between the search addresses and therefore valid RF data exists for the PRE to start processing. In the second case the write pointer falls in a memory region of the circular buffer where part of the data has either not yet been written or has already been overwritten for the search requested. In this second case the search is invalid.

For the case shown in the diagram as "invalid", a distinction is necessary between the case where RF data is not yet available and the case where the RF data for the search is no longer available and has been overwritten. For the first type of invalidity, the DPT engine will effectively stall the PRE engine from processing the data until the data request is actually available. For the second type of invalidity, an interrupt will be generated to the CPU, to the effect that the requested search could not be performed. A status word will be updated in a CPU readable register recording this event for the given PS and the next PS will be read in, thereby continuing the PS sequence processing.

Search Requirements for DPT PS

Based on the above considerations, and for simplicity of hardware implementation, the following are required to be programmed into the DPT PS and then to be used by the CBM to track data validity for a search:
a) Circular buffer address of SEARCH BASE (circular addressing as expected for CB)
b) Circular buffer address of SEARCH LIMIT (circular addressing as expected for CB)
c) Absolute page number for RF data with respect to which the above 2 addresses are generated (ABSOLUTE PAGE NUMBER). This number in conjunction with the circular buffer size (CIRCULAR_BUFFER_LIMIT−CIRCULAR_BUFFER_BASE as programmed in X7 registers) can be used to establish the absolute address of the base address of every page.

The logic inside the CBM will do the following:
a) Store the absolute page number used for writing RF data to the DDR memory every time the CB Wraparound occurs.
b) Every time the EPOCH occurs the RF write pointer (GPS/GLO) is stored along with the absolute page address and the EPOCH granularity up to 32 Mhz resolution.
c) Compare the search ranges given by the DPT PS with the current address (RF buffer write pointer for GPS and GLO) being generated. Several situations can occur in this comparison as below (all pointers/addresses are treated as being circularly generated unless otherwise mentioned):
  a. The write pointer is ahead or greater than the range specified by the 2 search pointers. In this case, data for the search has become available and the PRE engine can be informed by the DPT to read and process the data for FFT.
  However, because of various latencies in the AXI bus, which is used to access the DDR, a situation can also arise where the write pointer is ahead of both search addresses but the RF bridge has actually wrapped around at least once already causing the data to be overwritten and therefore the search to be invalid.
  One way to distinguish between these 2 situations is to use the third search parameter (ABSOLUTE PAGE NUMBER) which can be compared with the registered value of the absolute RF page number being updated every time there is a page rollover and as stated in (a) above. Assume that the wraparound has occurred and this registered page number is more than the ABSOLUTE PAGE. Under this condition if the write pointer is ahead of both the search pointers then we can conclude that the data has been overwritten. If the stored value is equal to the ABSOLUTE PAGE and the write pointer is more than both the search pointers then the data is still valid. If the stored page number value is less than the ABSOLUTE PAGE and the write pointer is more than both the search pointers then the data is not yet ready.
  b. The write pointer is below or less than the 2 search pointers. Here the situation is quite similar to that in (a) above. If the ABSOLUTE PAGE is equal to or more than the registered value of the page number then the data is not yet available. In the other case when the ABSOLUTE PAGE is less than the stored value there are 2 possibilities:
  i. The difference between stored and absolute page number is equal to 1. This corresponds to the circular buffer depth (CIRCULAR BUFFER LIMIT–CIRCULAR BUFFER BASE) and in this case the data is valid.
  ii. The difference between stored and absolute page number is greater than one—in this case the data has been overwritten and is no longer valid.
c. The write pointer is in between the 2 search ranges. In the type-1 search shown in FIG. 22, if the ABSOLUTE PAGE is less than the registered value of the page number, then this signifies that the data is no longer valid. In the other case, when the ABSOLUTE PAGE is equal to or greater than the registered value then the data can be considered yet to become valid. These situations are illustrated in FIG. 23.
d. Similar considerations arise for type-2 searches.

TME Integer Count Latching

Figure 24:
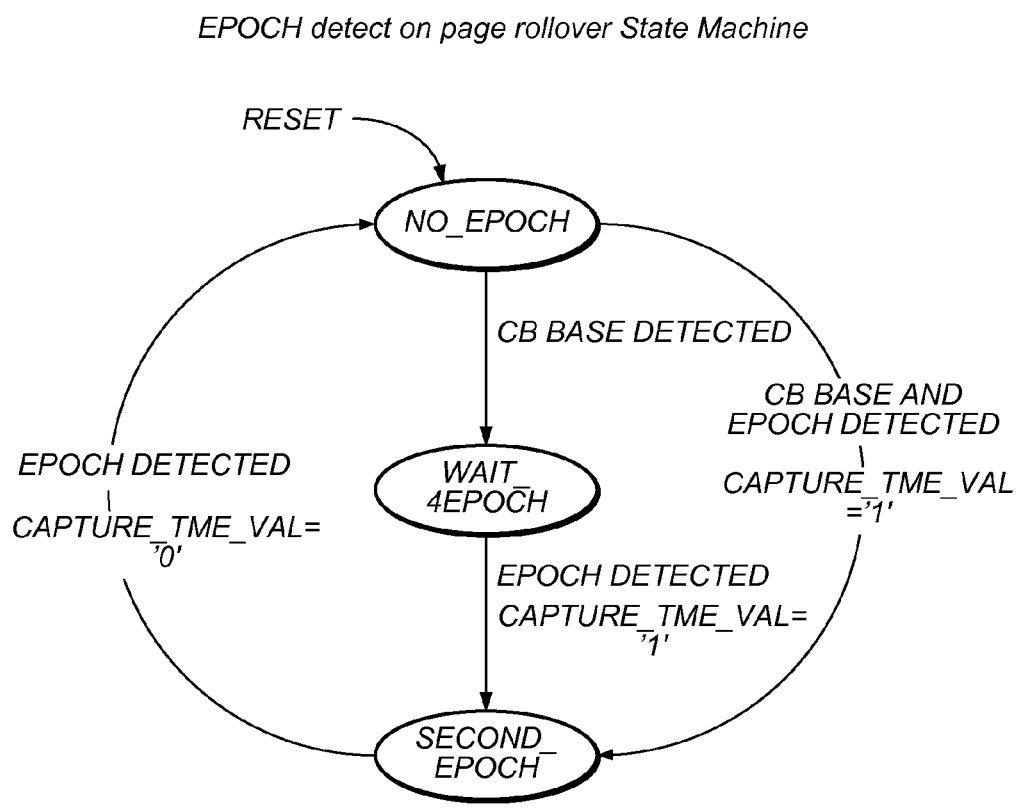

The playback portion of the subsystem can start after the TME counter has been enabled. S/W needs a mechanism to latch the value periodically to keep track of the absolute system time in order to calculate EPOCH spacings for future searches. In order to do this a finite state machine (FSM) has been designed which will periodically generate a control signal to the TME block to latch the current integer count into a register readable by the CPU. The state diagram for this FSM is shown in FIG. 24.

The TME latch enable signal is generated only when there is a page rollover followed by an EPOCH occurrence in the AXI clock domain (using data captured through the FIFO). The two events of page address coinciding with the CB base programmed in the DPT PS and the EPOCH always coincide when the RFB datapath is enabled (the DPT FSM has been released from reset). On subsequent page rollovers in the general case these will not coincide with an EPOCH. The FSM handles both cases and generates a signal called CB_CAPTURE_EPOCH_TIME to the TME which will cause the current integer value to be latched into a CPU readable register. This signal is asserted for one EPOCH duration i.e. 1 ms.

Page Section

The concept of page section is required because of the finite width of the page address counter. As searches are programmed into the CBM, the page numbers are updated continuously in both hardware and software. The CBM comparator needs to keep indicating correct search results (i.e. valid or stale) even when either the hardware or software page number resets to 0x0 after crossing the 0xFF boundary. This is handled in the design by doing a signed comparison between the RFB page counter in hardware versus the PS programmed page numbers in software. When these 2 are on opposite sides of the 0xFF boundary a signed comparison is enabled else the comparison between the pointers is always unsigned. This makes the assumption that H/W and S/W page pointers don't have a divergence of more than 128 pages, which is reasonable, given the expected depth of the circular buffer (>40 ms) and the fact that the hardware and software pointers track quite closely. In the DPT PS (DMA word #1) a bit called PAGE_SECTION is required to be programmed which will indicate if the page number has crossed the 0xFF boundary. This starts with a value of 0 and should toggle every time the 0xFF threshold is crossed. Similar behavior will occur for the hardware page pointer, and the signed comparison will kick in when the two page sections are different to indicate correct search validity results through the CBM.

EPOCH Address Table

When software programs the DPT PS into DDR it needs to program the page number of a given search (ABSOLUTE PAGE NUMBER) in addition to the SEARCH_BASE and SEARCH_LIMIT. This is essential for the CBM to indicate the validity of a search range that has been requested in the PS. To assist software with generating the page numbers of future searches in PS programmed to DDR a table is maintained in the hardware which gets updated whenever an EPOCH occurs. This table contains the following information:
  a) EPOCH index number (free running counter which updates when an EPOCH occurs)
  b) DDR Byte address for data word written when EPOCH occurred
  c) Page number for corresponding data in (b)
  d) MCLK32 cycle number within data word when EPOCH occurred (provides the necessary resolution for EPOCH recording)
  e) Current page section in hardware
  f) EPOCH detected after or with page rollover This table is maintained for the last 4 occurrences of EPOCH. The actual GPS and GLO word written to the FIFO is therefore 38 bits (32 bits of GPS/GLO data and a 6 bit field to denote the EPOCH offset). The word composition is described as below:
  For GPS data is written to the DDR once every 32 MCLK32 cycles and the EPOCH offset within the word denotes which of the last 32 MCLK32 cycles the EPOCH has appeared in. In case the EPOCH never occurred within the last 32 cycles a default value is recorded for the upper 6 bits which is 0x3F.
  For GLO data is written to the DDR once every 16 MCLK32 cycles and the EPOCH offset within the word denotes which of the last 16 MCLK32 cycles the EPOCH has appeared in. In case the EPOCH never occurred within the last 16 cycles a default value is recorded for the upper 6 bits which is 0x1F.

Additional Notes on CBM Processing

For Type-2 searches the SEARCH_BASE and SEARCH_LIMIT will span two pages since SEARCH_BASE is numerically greater than SEARCH_LIMIT. In this case the ABSOLUTE PAGE NUMBER to be programmed in the PS should refer to the second page (which contains SEARCH_LIMIT).

The CBM will not communicate partial search met criteria to the PRE—the signal indicating that data in circular buffer is ready will be communicated only AFTER the SEARCH_LIMIT has been crossed by the RFB pointer. However once the entire search area has been filled with RF data the search algorithm of the CBM will use the active PRE address and the SEARCH_LIMIT for tracking data validity instead of the SEARCH_BASE and SEARCH_LIMIT. This is done to avoid any false flagging of data being overwritten by the RFB when the PRE engine has already finished reading that part of the search data.

CBM Finite State Machine

To coordinate signaling the DPT FSM and the CBM a finite state machine has been designed. The main function of this FSM is to ensure that data validity tracking by the CBM is done only when requested by the main (DPT) FSM and use this information to generate the two primary outputs of the FSM, which are:

Circular Buffer Ready: PRE can successfully process RFB data

Figure 25:
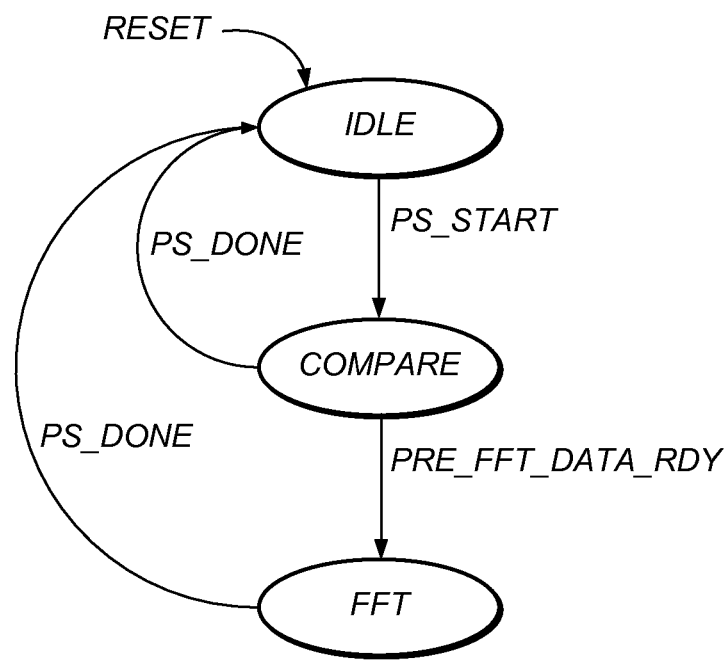

Circular Buffer Overwritten: RF data in Circular Buffer is stale and cannot be processed by PRE, the PS must be terminated and a new PING/PONG request should be issued FIG. 25 is a state diagram illustrating the CBM FSM.

The FSM exits the reset state (IDLE) once the DPT reads in a given PS and the search parameters are established (PS_START). In the COMPARE state the CB manager tracks the CB addresses and flags to the PRE engine when the search area in DDR requested for the given PS is ready (contains RF data). If the CB was overwritten during this phase then the PS is terminated from the DPT FSM and a PS done signal to sent to the CBM FSM which resets it to the IDLE state. If any other type of an exception occurs the DPT FSM signals a PS done signal to the CBM FSM and resets it to the IDLE state. If the search data is valid throughout the read operation of the PRE from the circular buffer then the CBM FSM will transition to the FFT state after the PRE signals to the FFT that the data is ready (PRE_FFT_DATA_RDY). In the FFT state the CBM FSM waits for completion of the PS which is indicated by assertion of the PS_DONE signal.

Interrupts and Status

There are 2 sources of interrupts from this block: RFB_IRQ and DPT_IRQ. Currently the interrupt connections are as follows:

a) RFB IRQ occurs on the following events:
2. RFB GPS FIFO overflow (long stall event on AXI)
3. RFB GLO FIFO overflow (long stall event on AXI)
b) DPT_IRQ occurs on the following events:
1. PS authentication error
2. PS count error
3. PS done
4. Circular Buffer overwrite
5. DPT PING PSS stop request completed
6. DPT PONG PSS stop request completed
7. DPT FSM reset complete
8. CPU DMA IRQ done DPT interrupts (a) through (d) are generated separately for PING and PONG PS chains. DPT IRQ source (g) will trigger whenever there is a fatal error and the DPT FSM is driven into reset (after flushing all AXI events). Note that error and PSS stop interrupts are generated only after all AXI transactions are flushed and the FSM is put in a quiescent state.

There are 2 IRQ registers for RFB_IRQ and DPT_IRQ respectively. The CPU can read these registers to know the status of the interrupt. Writing to the respective bit of the register from the CPU clears the interrupt.

There are 2 status registers in this block: RFB_STAT and DPT_STAT. These registers contain recordings of events as these happen in hardware in real-time. The events that are recorded are as below:

a) RFB_STAT:
a. RFB GPS FIFO empty
b. RFB GLO FIFO empty
b) DPT_STAT:
a. PING processing in progress
b. PONG processing in progress
c. Circular Buffer ready
d. All PRE and FFT requests masked
e. All DPT source requests masked
f. DPT FSM state
g. PS_DONE
h. DPT PS TRANSFER ACTIVE
i. RFB TRANSFER ACTIVE
j. PRE TRANSFER ACTIVE
k. FFT TRANSFER ACTIVE
l. PRE TURBO TRANSFER IN PROGRESS
m. FFT TURBO TRANSFER IN PROGRESS
n. TURBO REQUEST PHASE1 DONE
o. CB FSM STATE
p. EPOCH DETECT FSM STATE
q. SIGNED/VERSUS UNSIGNED COMPARE IN CBM
r. EXPECTED DPT PS COUNT Dataflow Example The dataport subsystem's interface to the DDR is used for the following operations by the various data engines:

| | |
|---|---|
| a) RFB - writes only | (raw RF data, GPS and GLO, 2 streams) |
| b) PRE - reads only | (configuration (PS) and raw RF data) |
| c) FFT - reads and writes | (configuration(PS) and FFT, IFFT, accumulation of PRE data) |
| d) CPU - reads and writes | (DMA to processor memories, not currently implemented) |
| e) DPT - reads only | (configuration (PS)) |

Two types of data will be read/written from the DDR region by the DPT, RFB, PRE and FFT:

a) Programming structures
  a. DPT PS will contain the addresses and some control information related to the search to be used by the RFB, PRE and FFT engines.
  b. PRE and FFT PS will contain parameters related to the DSP operations
(Doppler shift etc.) required for the search. There is no PS required for the RFB.
b) Data for DSP operations:
  a. RFB will write the raw RF data to the circular buffer region, the address of which is available from the X7 programmed registers
  b. PRE will use the search region pointed to by the DPT PS for preprocessing the search data
  c. FFT will use the non-coherent search region pointed to by the DPT PS for FFT, IFFT, accumulation and peak search.

The DPT addressing mechanisms for these two cases may be described as follows:

The programming structures (PS) for the dataport and FFT are stored in DDR region in increments of 64 bytes. The PS for the PRE is stored in DDR in increments of 128 bytes. A total of 21 bits of address in the DDR memory space (2 MB) available to the dataport for its transactions; however only the upper 15 bits are programmable by software for storing the PS for DPT/FFT, 14 bits for PRE. These 15/14 bits of address for the PS region are stored in the CPU peripheral registers and not the DPT PS itself, as the PS addresses for the various sources themselves are not expected to change very frequently and can be configured by the CPU through its peripheral bus. The lower 6 bits for DPT/FFT and 7 bits for PRE of the PS address are updated by the DPT FSM.

The data from the RFB, PRE and FFT is stored in DDR addresses as per the programmed values in the DPT PS. RFB will write to the circular buffer area, PRE will read the RF data from the search areas and the FFT will use the non-coherent memory location, the initial value of which is found from the DPT PS. As the DPT FSM cycles through its states these addresses are incremented for the next data to be written to DDR (RFB), next data to be used for pre-processing by the PRE and next address to be used for read/write operations by the FFT. In summary there are separate counters and initialization/increment signals for the PS and data areas for the PRE and FFT engines. The RFB does not fetch any PS.

An example dataflow is presented below:
a) Software enables the dataport state machine and also the RFB, PRE and FFT port controls by writing to the DPT_PING_XFR_REQ_VALID register.
b) DPT state machine fetches its own PS from the PING PS address. The address used is as described above i.e. upper 15 bits as programmed in CPU peripheral registers, lower 6 bits from its own increment (reset to "0" for first iteration of the PS fetches).
c) DPT FSM drops into WAIT_4REQ state (FIG. 3) after its reset is deasserted and waits to service DDR memory access requests from RFB/PRE/FFT or CPU. The priority of transfers is expected to be RFB>FFT>PRE>CPU.
d) RFB is released from reset and the EPOCH timer is started. As RFB fills up its FIFO as per the CPU preprogrammed thresholds it requests the DPT to transfer data to the DDR.
e) When turned on, the PRE requests DPT access to DDR to fetch its own PS.
f) When turned on, the FFT requests DPT access to DDR to fetch its own PS.
g) The circular buffer manager tracks the address pointers currently used for writing to the DDR region by the RFB and does a continuous comparison of this with the search ranges provided by the DPT PS. If the data requested for the search by the PRE in (e) above is available it grants the PRE engine access to the DDR. Else it informs the DPT that the data requested for the search has been overwritten.
h) Then the PRE requests DPT for read access to the DDR to use this search data.
i) After the PRE reads and processes all the search data it informs the FFT that the output vectors are ready.
j) For the first cycle of non-coherent (NC) processing the FFT reads the PRE data (via an internal PRE-DDR link and not over the DDR bus), performs FFT on this and writes this to the DDR memory (NC region as specified in DPT PS).
k) For all the remainder of the NC processing, the FFT continues its reads and writes from DDR as it performs FFT and accumulation on the processed data samples from the PRE.
l) When the FFT is done with its processing it informs the DPT and PRE state machines with a PS_DONE signal. The DPT FSM drops to the WAIT_4REQ state for its next PS fetch. Note that it is ensured that since the RFB has highest priority and is continuously writing to the DDR, all pending RFB requests are serviced before the FSM services any DPT/PRE/FFT requests.
m) Steps (b) through (l) are repeated for each PS; essentially this means that every PS corresponds to one full search.
n) When the last PS is fetched (indicated by last word of DPT PS), this is processed and then the state machines for DPT, PS and PRE revert to the WAIT_4REQ state.
o) If there is a pending PONG request during this PSS processing (done by CPU write to DPT_PONG_XFR_REQ_VALID) then the DPT FSM will start processing from INIT_DPT_RD state (begins by fetching its own PS from the PONG PS location).
p) If this flag was not set then the DPT FSM will idle in WAIT_4REQ state till either a DPT_PING_XFR_REQ_VALID or a DPT_PONG_XFR_REQ_VALID is issued by the CPU.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system for facilitating data transfers with a shared non-local memory, comprising:
    a radio frequency (RF) subsystem including an antenna for receiving data;
    one or more signal processors to process the data; and
    a first data transfer controller for facilitating transfer of the data between the system and the shared non-local memory over a non-deterministic bus shared by at least a second data transfer controller, the first data transfer controller to:
        receive a real-time data transfer request from the RF subsystem to transfer real-time data to the shared non-local memory;
        assign a first priority level to the real-time data transfer request;
        receive a playback data transfer request from the one or more signal processors to transfer playback data between the one or more signal processors and the shared non-local memory;
        assign a second priority level to the playback data transfer request; and
        initiate a real-time data transfer corresponding to the real-time data transfer request based on the first priority level being higher than the second priority level.

2. The system of claim 1,
    wherein the one or more signal processors include a Pre-Summer and a Fast Fourier Transform component.

3. The system of claim 2,
    wherein the real-time data transfer request corresponds to a request to write Global Positioning System (GPS) data or global navigational satellite system (GLONASS) data to the shared non-local memory in order to be processed by the PreSummer and the Fast Fourier Transform component in real-time.

4. The system of claim 1, wherein the first data transfer controller is further to:
    wait, initially, in a fully idle state in which data transfer requests are not accepted;
    transition to a ready idle state in which data transfer requests are accepted, wherein the real-time and playback data transfer requests are received when the first data transfer controller is in the ready idle state;
    determine that a fatal error has occurred after initiating the real-time data transfer, the fatal error corresponding to either (i) a request for real-time data that has been overwritten in a local buffer of the RF subsystem and not yet transferred to the shared non-local memory, or (ii) a request that the first data transfer controller cease use of the non-deterministic bus; and
    in response to determining that the fatal error has occurred, complete the real-time data transfer and transition to the fully idle state until the fatal error is lifted.

5. The system of claim 1, wherein the first data transfer controller is further to:
    wait, initially, in a fully idle state in which data transfer requests are not accepted;
    transition to a ready idle state in which data transfer requests are accepted, wherein the real-time and playback data transfer requests are received when the first data controller is in the ready idle state;
    determine that a critical error has occurred after initiating the real-time data transfer, the critical error corresponding to either (i) an invalid data transfer request, or (ii) a data transfer request for overwritten data in the shared non-local memory; and in response to determining that the critical error has occurred, terminate the real-time data transfer and transition to the ready idle state until the critical error is lifted.

6. The system of claim 1, wherein the system is a global navigational satellite (GNS) system, and wherein the real-time data transfer is for GNS data.

7. The system of claim 6, wherein the one or more signal processors are to process both global positioning system (GPS) and global navigation satellite system (GLONASS) data.

8. The system of claim 1,
wherein the first data transfer controller comprises a finite state machine implemented in hardware.

9. The system of claim 1,
wherein the system and the shared non-local memory operate in different clock domains.

10. A method for facilitating data transfers between a system, including a first data transfer controller, and a shared non-local memory over a non-deterministic bus shared by at least a second data transfer controller, the method being performed by the first data transfer controller and comprising:
receiving a real-time data transfer request from a radio frequency (RF) subsystem, included in the system, to transfer real-time data to the shared non-local memory;
assigning a first priority level to the real-time data transfer request;
receiving a playback data transfer request from a signal processor, included in the system, to transfer playback data between the signal processor and the shared non-local memory;
assigning a second priority level to the playback data transfer request; and
initiating a real-time data transfer corresponding to the real-time data transfer request based on the first priority level being higher than the second priority level.

11. The method of claim 10,
wherein the signal processor includes a PreSummer and a Fast Fourier Transform component.

12. The method of claim 11,
wherein the real-time data transfer request corresponds to a request to write Global Positioning System (GPS) data or global navigational satellite system (GLONASS) data to the shared non-local memory in order to be processed by the PreSummer and the Fast Fourier Transform component in real-time.

13. The method of claim 10, further comprising:
waiting, initially, in a fully idle state in which data transfer requests are not accepted;
transitioning to a ready idle state in which data transfer requests are accepted, wherein the real-time and playback data transfer requests are received when the first data transfer controller is in the ready idle state;
determining that a fatal error has occurred after initiating the real-time data transfer, the fatal error corresponding to either (i) a request for real-time data that has been overwritten in a local buffer of the RF subsystem and not yet transferred to the shared non-local memory, or (ii) a request that the first data transfer controller cease use of the non-deterministic bus; and
in response to determining that the fatal error has occurred, completing the real-time data transfer and transitioning to the fully idle state until the fatal error is lifted.

14. The method of claim 10, further comprising:
waiting, initially, in a fully idle state in which transfer requests are not accepted;
transitioning to a ready idle state in which data transfer requests are accepted, wherein the real-time and playback data transfer requests are received when the first data transfer controller is in the ready idle state;
determining that a critical error has occurred after initiating the real-time data transfer, the critical error corresponding to either (i) an invalid data transfer request, or (ii) a data transfer request for overwritten data in the shared non-local memory; and
in response to determining that the critical error has occurred, terminating the real-time data transfer and transitioning to the ready idle state until the critical error is lifted.

15. The method of claim 10,
wherein the system is a global navigational satellite (GNS) system, and wherein the real-time data transfer is for GNS data.

16. The method of claim 15, wherein the signal processor is to process both global positioning system (GPS) and global navigation satellite system (GLONASS) data.

17. The method of claim 10,
wherein the system and the shared non-local memory operate in different clock domains.

18. A global navigational satellite (GNS) system, comprising:
a radio frequency (RF) subsystem including an antenna for receiving data;
one or more digital signal processors to process the data; and
a first data transfer controller for facilitating transfer of the data between the GNS system and a shared non-local memory accessible via a non-deterministic bus shared by at least a second data transfer controller, the first data transfer controller to:
receive a real-time data transfer request from the RF subsystem to transfer real-time data to the shared non-local memory;
assign a first priority level to the real-time data transfer request;
receive a playback data transfer request from the one or more digital signal processors to transfer playback data between the one or more digital signal processors and the shared non-local memory;
assign a second priority level to the playback data transfer request; and
initiate a real-time data transfer corresponding to the real-time data transfer request based on the first priority level being higher than the second priority level.

* * * * *